(12) United States Patent
Yu et al.

(10) Patent No.: US 10,373,885 B2
(45) Date of Patent: Aug. 6, 2019

(54) 3D STACKED-CHIP PACKAGE

(71) Applicant: Taiwan Semiconductor Manufacturing Company, Ltd., Hsinchu (TW)

(72) Inventors: Chen-Hua Yu, Hsinchu (TW); Ming-Fa Chen, Taichung (TW); Wen-Sen Lu, Hsinchu (TW); Wen-Chih Chiou, Zhunan Township (TW); Wen-Ching Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 15/608,466

(22) Filed: May 30, 2017

(65) Prior Publication Data
US 2017/0263519 A1    Sep. 14, 2017

Related U.S. Application Data

(62) Division of application No. 14/462,791, filed on Aug. 19, 2014, now Pat. No. 9,666,520.
(Continued)

(51) Int. Cl.
*H01L 23/31* (2006.01)
*H01L 23/00* (2006.01)
(Continued)

(52) U.S. Cl.
CPC ..... *H01L 23/3114* (2013.01); *H01L 21/31111* (2013.01); *H01L 21/565* (2013.01); *H01L 21/76805* (2013.01); *H01L 21/76831* (2013.01); *H01L 21/76897* (2013.01); *H01L 21/76898* (2013.01); *H01L 23/3157* (2013.01);
(Continued)

(58) Field of Classification Search
None
See application file for complete search history.

(56) References Cited

U.S. PATENT DOCUMENTS 6,607,938 B2    8/2003  Kwon et al.
6,867,073 B1    3/2005  Enquist
(Continued)

FOREIGN PATENT DOCUMENTS

CN    101091243 A    12/2007
CN    102931102 A    2/2013
(Continued)

*Primary Examiner* — Michelle Mandala
(74) *Attorney, Agent, or Firm* — Slater Matsil, LLP

(57) ABSTRACT

Disclosed herein is a package comprising a first die having a first redistribution layer (RDL) disposed on a first side of a first substrate and a second die having a second RDL disposed on a first side of a second substrate, with the first RDL bonded to the second RDL. A third die having a third RDL is disposed on a first side of a third substrate, the third die mounted over the second die, with the second die disposed between the first die and the third die. First vias extend through, and are electrically isolated from, the second substrate, with the first vias each contacting a conductive element in the first RDL or the second RDL. Second vias extend through, and are electrically isolated from, the third substrate, with the second vias each contacting a conductive element in the third RDL or one of the first vias.

20 Claims, 35 Drawing Sheets

Related U.S. Application Data

(60) Provisional application No. 61/986,653, filed on Apr. 30, 2014.

(51) Int. Cl.
| | | |
|---|---|---|
| *H01L 23/538* | (2006.01) | |
| *H01L 25/00* | (2006.01) | |
| *H01L 21/768* | (2006.01) | |
| *H01L 21/56* | (2006.01) | |
| *H01L 23/36* | (2006.01) | |
| *H01L 23/48* | (2006.01) | |
| *H01L 23/498* | (2006.01) | |
| *H01L 23/522* | (2006.01) | |
| *H01L 25/065* | (2006.01) | |
| *H01L 21/311* | (2006.01) | |

(52) U.S. Cl.
CPC ............ *H01L 23/36* (2013.01); *H01L 23/481* (2013.01); *H01L 23/49816* (2013.01); *H01L 23/49827* (2013.01); *H01L 23/522* (2013.01); *H01L 23/5384* (2013.01); *H01L 24/08* (2013.01); *H01L 24/09* (2013.01); *H01L 24/24* (2013.01); *H01L 24/81* (2013.01); *H01L 24/89* (2013.01); *H01L 24/92* (2013.01); *H01L 25/00* (2013.01); *H01L 25/0657* (2013.01); *H01L 25/50* (2013.01); *H01L 24/03* (2013.01); *H01L 24/06* (2013.01); *H01L 24/20* (2013.01); *H01L 24/80* (2013.01); *H01L 24/82* (2013.01); *H01L 2224/0239* (2013.01); *H01L 2224/02372* (2013.01); *H01L 2224/04105* (2013.01); *H01L 2224/05647* (2013.01); *H01L 2224/08145* (2013.01); *H01L 2224/09181* (2013.01); *H01L 2224/11* (2013.01); *H01L 2224/12105* (2013.01); *H01L 2224/18* (2013.01); *H01L 2224/20* (2013.01); *H01L 2224/24146* (2013.01); *H01L 2224/32245* (2013.01); *H01L 2224/73217* (2013.01); *H01L 2224/73267* (2013.01); *H01L 2224/80896* (2013.01); *H01L 2224/821* (2013.01); *H01L 2224/82031* (2013.01); *H01L 2224/8385* (2013.01); *H01L 2224/9202* (2013.01); *H01L 2224/9212* (2013.01); *H01L 2224/92144* (2013.01); *H01L 2224/92244* (2013.01); *H01L 2224/94* (2013.01); *H01L 2224/96* (2013.01); *H01L 2225/06544* (2013.01); *H01L 2924/01014* (2013.01); *H01L 2924/05442* (2013.01); *H01L 2924/37* (2013.01)

(56) References Cited

U.S. PATENT DOCUMENTS

| | | | |
|---|---|---|---|
| 7,795,139 | B2 | 9/2010 | Han et al. |
| 8,350,377 | B2 | 1/2013 | Yang |
| 8,975,726 | B2 | 3/2015 | Chen et al. |
| 9,059,109 | B2 | 6/2015 | Lin et al. |
| 9,698,081 | B2 | 7/2017 | Yu et al. |
| 9,806,055 | B2 | 10/2017 | Yu et al. |
| 9,905,436 | B2 * | 2/2018 | Oh ....................... H01L 21/4825 |
| 10,163,859 | B2 * | 12/2018 | Yu ........................... H01L 24/25 |
| 2003/0017647 | A1 | 1/2003 | Kwon et al. |
| 2004/0021139 | A1 | 2/2004 | Jackson et al. |
| 2005/0104219 | A1 | 5/2005 | Matsui |
| 2008/0116584 | A1 | 5/2008 | Sitaram |
| 2008/0318361 | A1 | 12/2008 | Han et al. |
| 2011/0133339 | A1 | 6/2011 | Wang |
| 2011/0204505 | A1 | 8/2011 | Pagaila et al. |
| 2013/0040423 | A1 | 2/2013 | Tung et al. |
| 2013/0285257 | A1 | 10/2013 | Lee et al. |
| 2014/0264933 | A1 | 9/2014 | Yu et al. |
| 2015/0145593 | A1 | 5/2015 | Johnson |
| 2015/0325497 | A1 | 11/2015 | Yu et al. |
| 2015/0325520 | A1 | 11/2015 | Yu et al. |
| 2018/0122862 | A1 | 5/2018 | Choi et al. |

FOREIGN PATENT DOCUMENTS

| | | |
|---|---|---|
| CN | 103730434 A | 4/2014 |
| KR | 20030008615 A | 1/2003 |
| KR | 1020030008615 A | 1/2003 |
| TW | 201208004 A | 2/2012 |

* cited by examiner

3D STACKED-CHIP PACKAGE

PRIORITY CLAIM AND CROSS-REFERENCE

This application is a divisional of U.S. application Ser. No. 14/462,791, filed Aug. 19, 2014, which claims the benefit of U.S. Provisional Application No. 61/986,653, filed on Apr. 30, 2014, titled "3D Chip-on-Wafer-on-Substrate," which application is hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
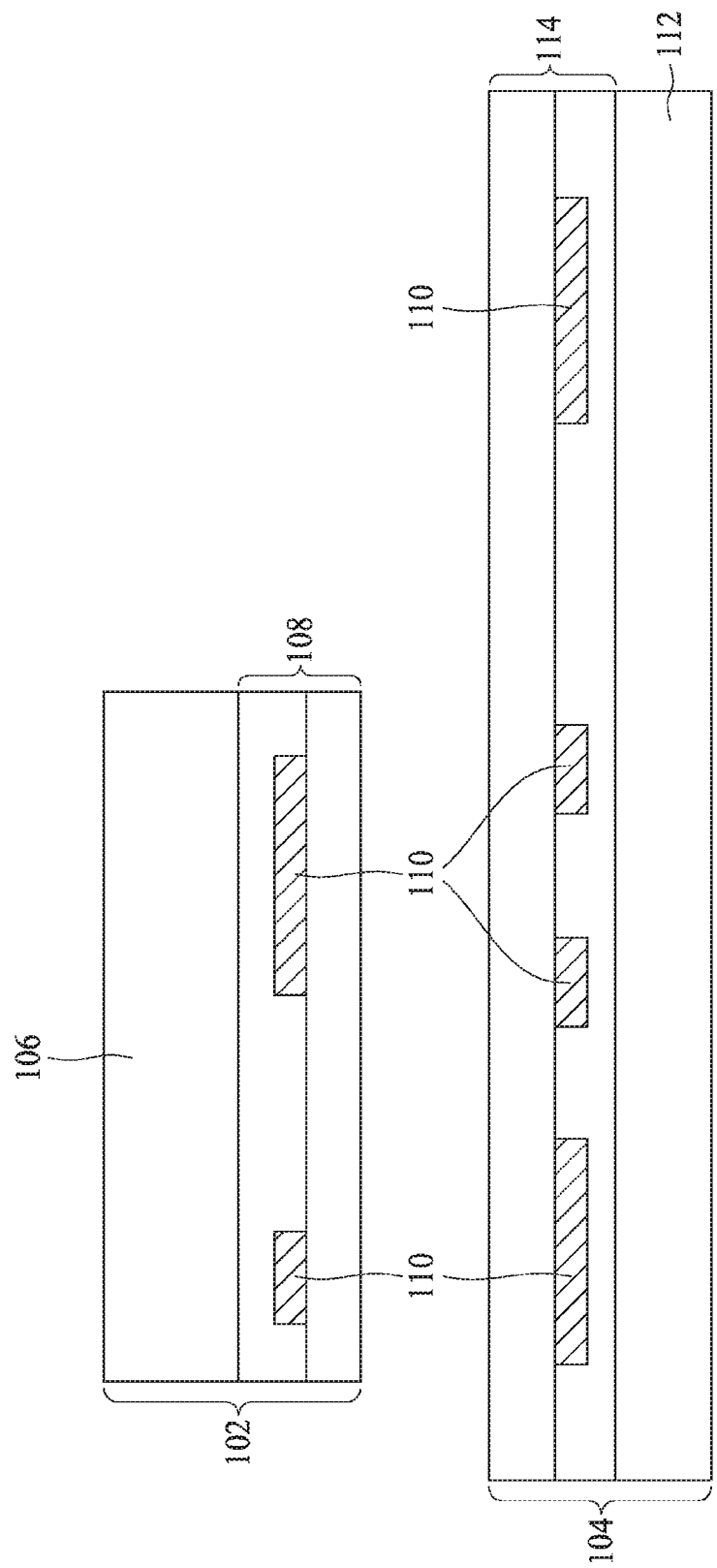
FIGS. 1-15 illustrate cross-sectional views of intermediate processing steps in forming a chip-on-wafer structure using a via last process according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices are bonded together to form packages with various capabilities. In some processes, dies, wafers or a combination of dies and wafers, are bonded together using direct surface bonding such as oxide-to-oxide bonding, through hybrid bonding, or the like. It has been discovered that interconnections between bonded wafers can be provided using a via last process. In the via last process, the vias are formed through one of the dies after the dies have been bonded to provide electrical connection between the dies and external connectors using a self-aligning insulating spacer on the sidewalls of the via openings. The self-aligning spacer on the sidewalls permits narrower, taller vias, and improves the aspect ratio of the vias to between about 3 and about 10. The improved aspect ratio results in more compactly arranged via arrays.

It has further been discovered that the via last process permits stacking of numerous dies, as connectivity between dies in a package, or between dies and external connectors can be provided by embodiments of the via last processes disclosed herein. Vias are formed after bonding each die or layer of dies. Vias are formed to connect to a previously bonded die, or to a previously formed via in a lower die. External connectors are provided over the top or layer die, with the external connectors connecting the vias to a power source or providing communication with another die, substrate, package, or the like.

FIG. 1 illustrates a cross-sectional view of a wafer 104 and die 102 prior to bonding according to an embodiment. A die 102 comprises a die substrate 106 such as a semiconductor having one or more active devices formed therein. A die redistribution layer (RDL) 108 is disposed on the die substrate 106. The die RDL 108 comprises one or more dielectric layers with conductive elements 110 disposed in the dielectric layers. The die RDL 108 is formed over the side of the substrate having the active devices, with the conductive elements 110 connecting to the active devices on the die substrate 106.

The wafer 104 has a wafer RDL 114 disposed over a wafer substrate 112. In some embodiments, the wafer substrate 112 is a semiconductor with one or more active devices formed therein. The wafer RDL 114 is formed over the active devices in the wafer substrate 112 and has one or more conductive elements 110 disposed in dielectric layers.

Figure 2:
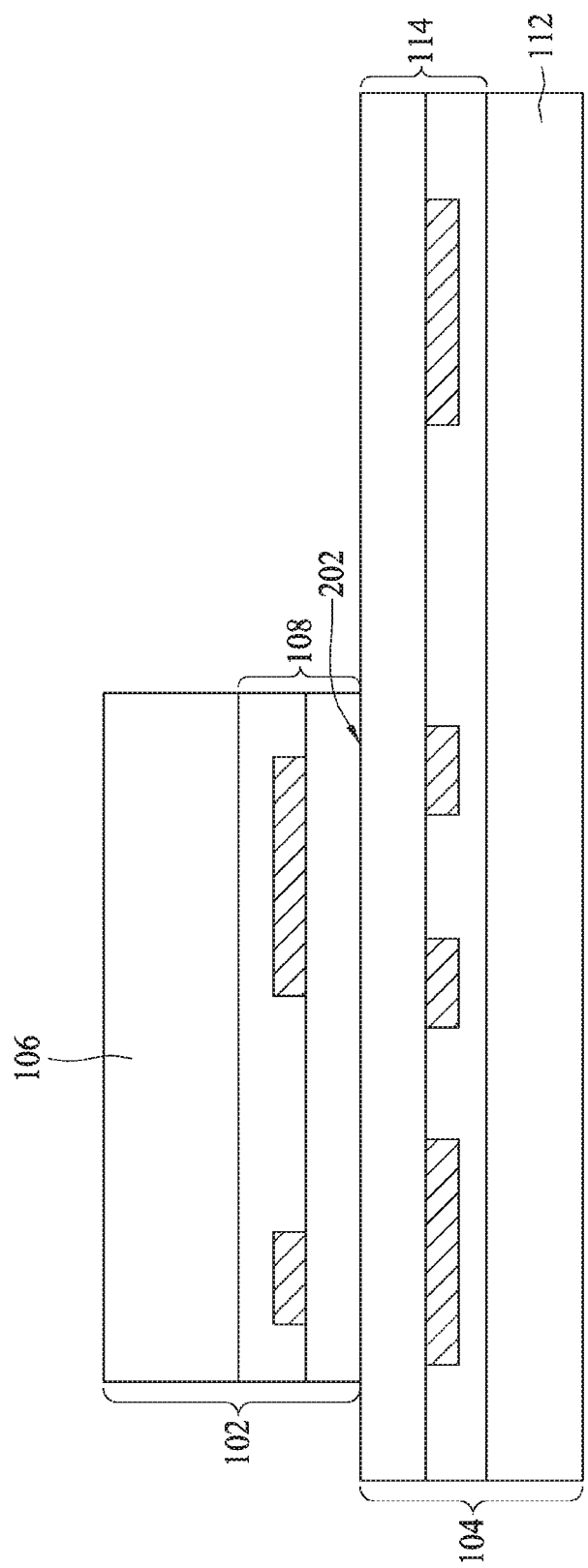

FIG. 2 illustrates a cross-sectional view of a processing step for bonding a wafer according to an embodiment. The die 102 and wafer 104 are bonded at the top surfaces of the RDLs 108 and 114, forming a bond interface 202. The die 102 and wafer 104 are used as the basis for a package having connections for mounting the package to external devices, substrates, or the like. In some embodiments, the die 102 is bonded to the wafer 104 by, for example, direct surface bonding, metal-to-metal bonding, hybrid bonding, or another bonding process. A direct surface bonding process creates an oxide-to-oxide bond or substrate-to-substrate bond through a cleaning and/or surface activation process followed by applying pressure, heat and/or other bonding process steps to the joined surfaces. In some embodiments, the die 102 and wafer 104 are bonded by metal-to-metal bonding that is achieved by fusing conductive elements 110, such as metal bond pads, exposed at the surfaces of the RDLs 108 and 114. In other embodiments, hybrid bonding is used to bond the die 102 and wafer 104 by a combination of direct surface bonding and metal-to-metal bonding, where both the surfaces of the RDLs 108 and 114 and the surfaces of metal bond pads exposed at the surfaces of the RDLs 108 and 114 are bonded. In some embodiments, the bonded dies are baked, annealed, pressed, or otherwise treated to strengthen or finalize the bond.

Figure 3:
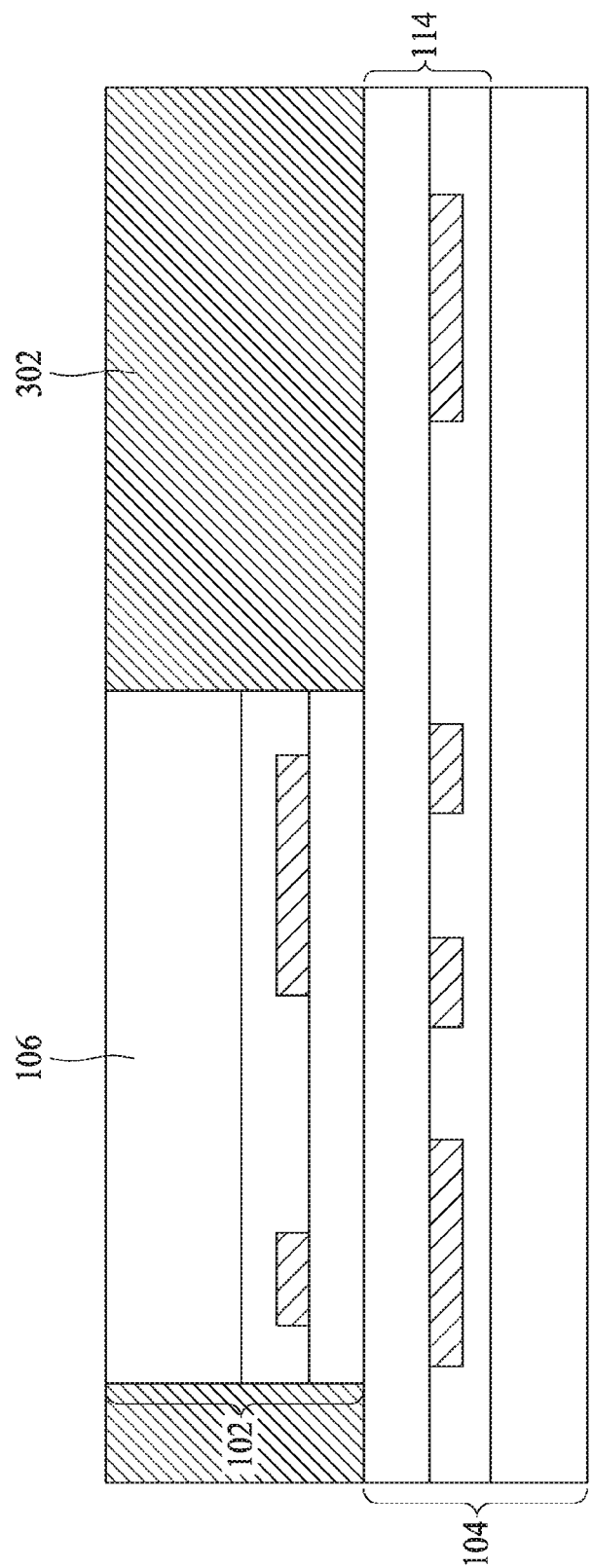

FIG. 3 is a cross-sectional view of forming molding compound 302 over the package according to an embodiment. The molding compound 302 is formed around the die 102 and on the wafer RDL 114. In some embodiments, the molding compound 302 is shaped or molded using for example, a mold (not shown) which may have a border or other feature for retaining molding compound 302 when applied. Such a mold may be used to pressure mold the molding compound 302 around the die 102 to force the molding compound 302 into openings and recesses, eliminating air pockets or the like in the molding compound 302. In an embodiment, the molding compound 302 is a nonconductive or dielectric material, such as an epoxy, a resin, a moldable polymer such as PBO, or another moldable material. For example, molding compound 302 is an epoxy or resin that is cured through a chemical reaction or by drying. In another embodiment, the molding compound 302 is an ultraviolet (UV) cured polymer.

After the molding compound 302 is formed over the die 102 and wafer 104, the molding compound 302 is reduced or planarized by, for example, grinding, a chemical-mechanical polish (CMP), etching or another process. In some embodiments, the molding compound 302 extends over the die 102 after planarization, and in other embodiments, the molding compound is reduced so that the die 102 is exposed. The die substrate 106 is, in some embodiment, thinned or reduced in the same process as the molding compound, resulting in a die 102 backside surface that is substantially planar with the molding compound surface.

Figure 4:
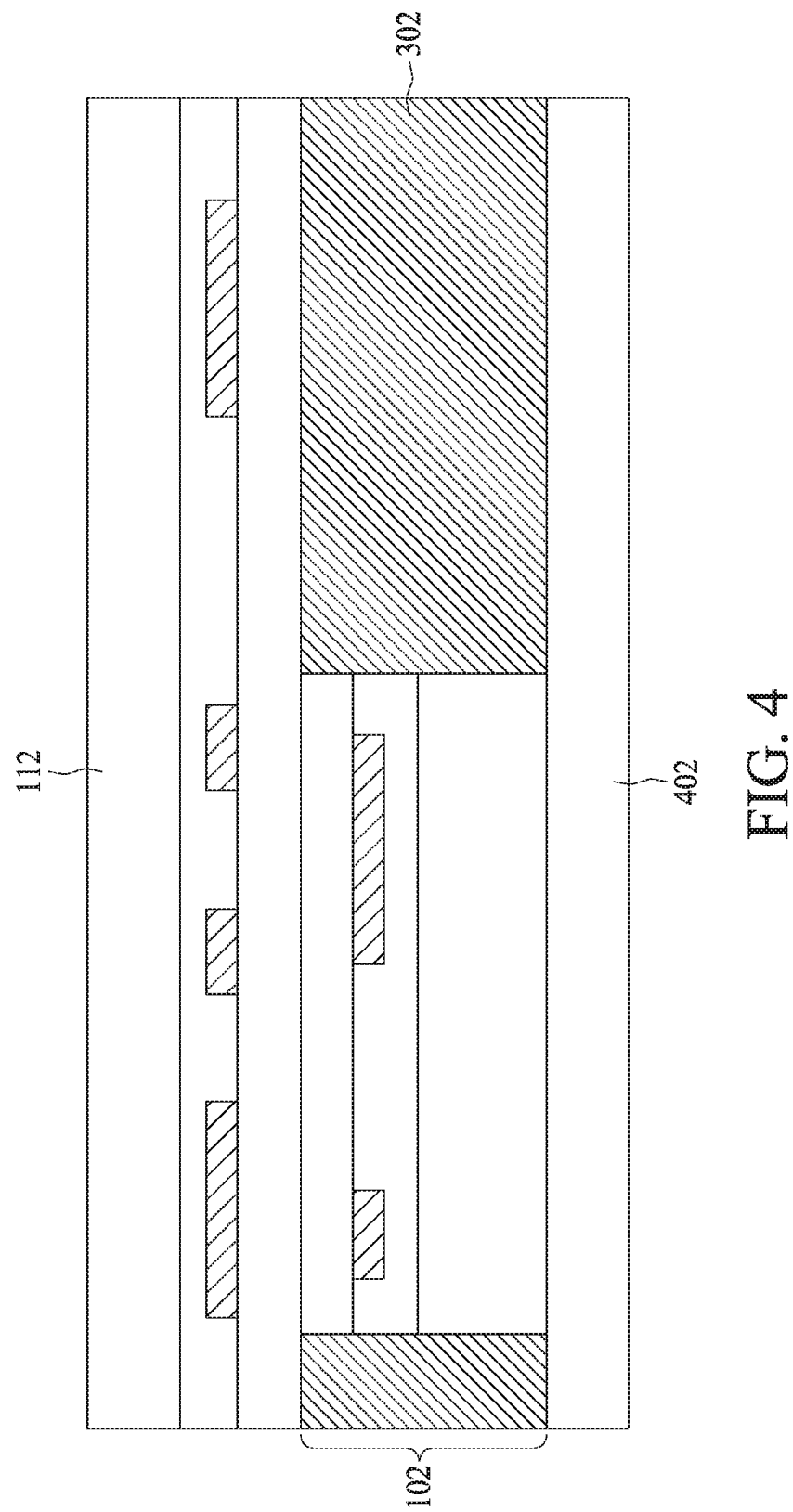

FIG. 4 is a cross-sectional view of mounting the package to a carrier 402 according to an embodiment. The package is inverted to permit access to, and processing through the wafer substrate 112. The die 102 and molding compound 302 surface are bonded to, for example, a glass carrier, or other handling substrate. The package is attached to the carrier 402 using die attachment film (DAF), an adhesive, or the like. In other embodiments, the package is attached to the carrier 402 with the wafer substrate 112 on the carrier 402, permitting processing of the package through the die side of the package. In some embodiments, the wafer substrate 112 is also thinned or reduced by grinding, CMP, etching or another process.

Figure 5:
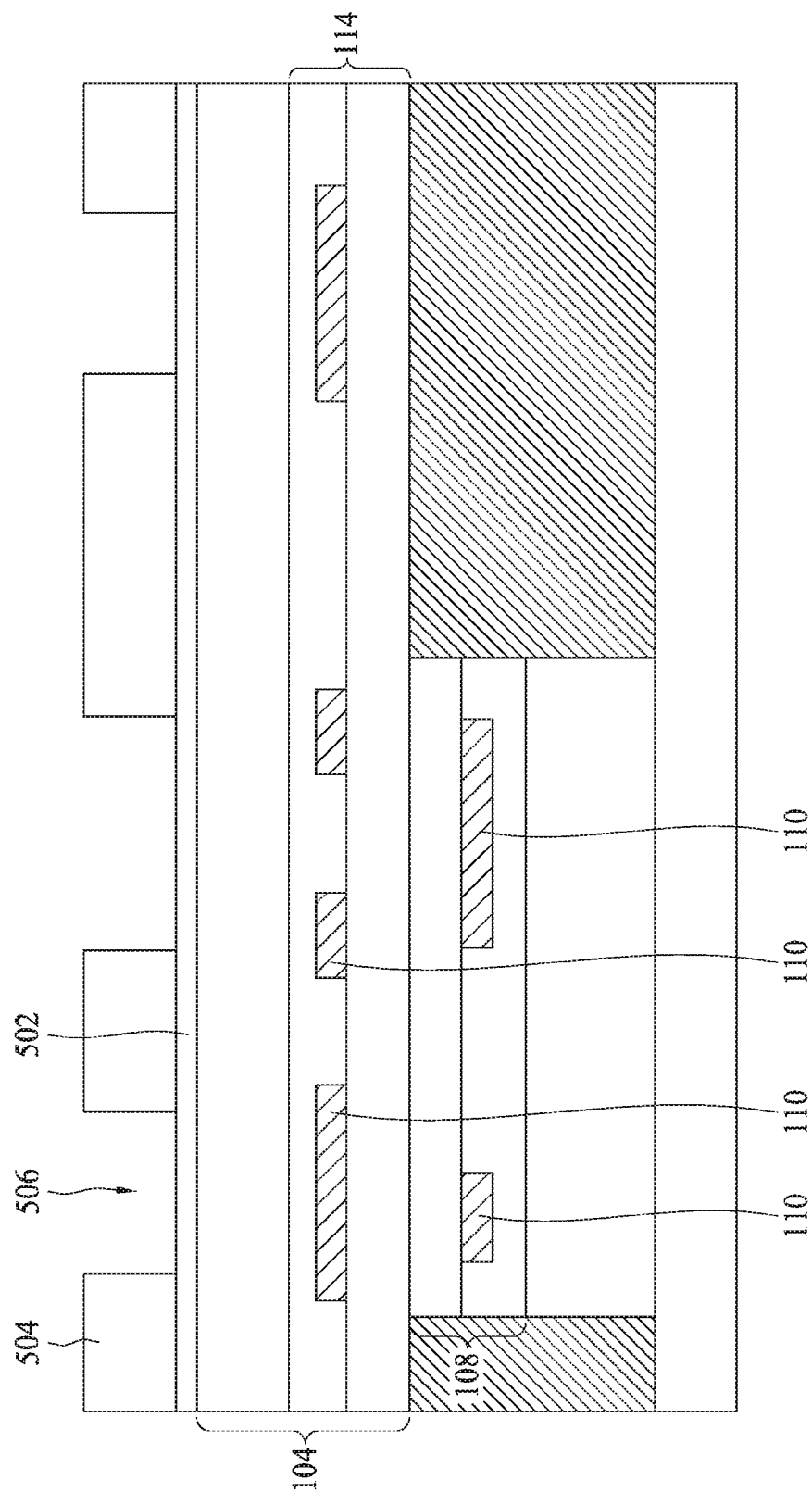

FIG. 5 is a cross-sectional view illustrating masking the wafer substrate 112 according to an embodiment. An etch stop layer 502 is formed on the wafer substrate 112, and is formed from a material that has a high etch selectivity compared to the material of the wafer substrate 112. Additionally, the etch stop layer 502 has a high etch selectivity compared to the wafer RDL 114 and die RDL 108. In some embodiments where the wafer substrate 112 is, for example, silicon and the RDLs 114 and 108 are silicon oxide, the etch stop layer 502 is a nitride such as silicon nitride (SiN), a carbide such as silicon carbide (SiC) or an oxynitride such as silicon oxynitride (SiON), or another etch stop material. In such an embodiment, the etch stop layer is deposited by deposited using chemical vapor deposition (CVD), plasma enhanced CVD (PECVD), physical vapor deposition (PVD), epitaxy, a spin-on process, or another deposition process.

A mask 504 is formed over the etch stop layer 502 and is patterned to form openings 506 exposing portions of the etch stop layer 502. The mask 504 is, in some embodiments, a photoresist that is deposited, exposed and developed. The openings 506 in the mask 504 are aligned over conductive elements 110 in the RDLs 108 and 114.

Figure 6:
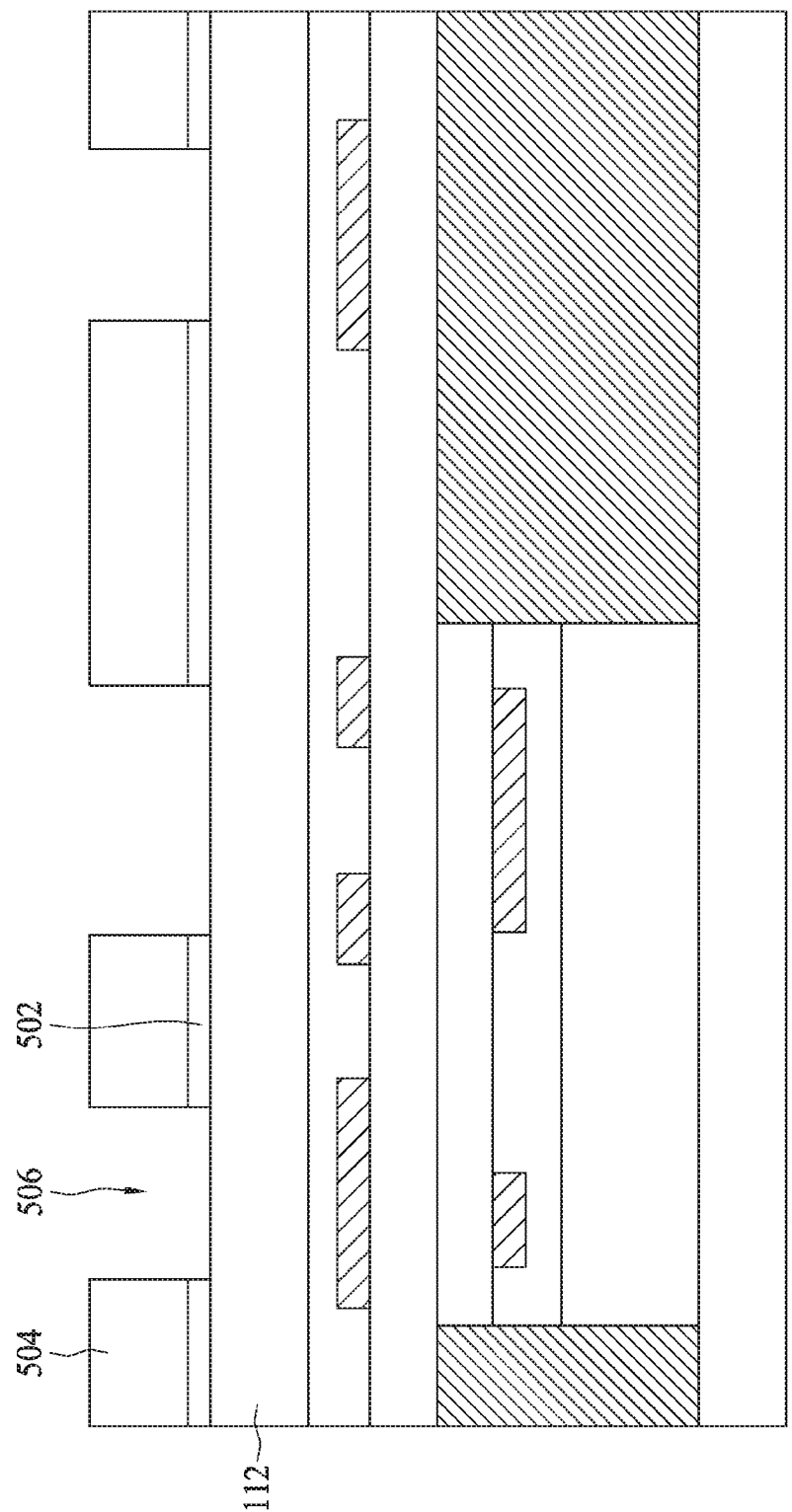

FIG. 6 is a cross-sectional view illustrating etching of the etch stop layer 502 according to an embodiment. The etch stop layer 502 is etched to expose the wafer substrate 112. In some embodiment, the etch stop layer 502 is etched with a dry plasma etch, such as an oxygen or nitrogen plasma with a fluorine based etchant such as carbon tetrafluoride ($CF_4$) or sulfur hexafluoride ($SF_6$). In other embodiments, the etch stop layer 502 is etched by a wet etch; using for example, sulfuric acid ($H_2SO_4$) heated phosphoric acid ($H_3PO_4$), or the like.

Figure 7:
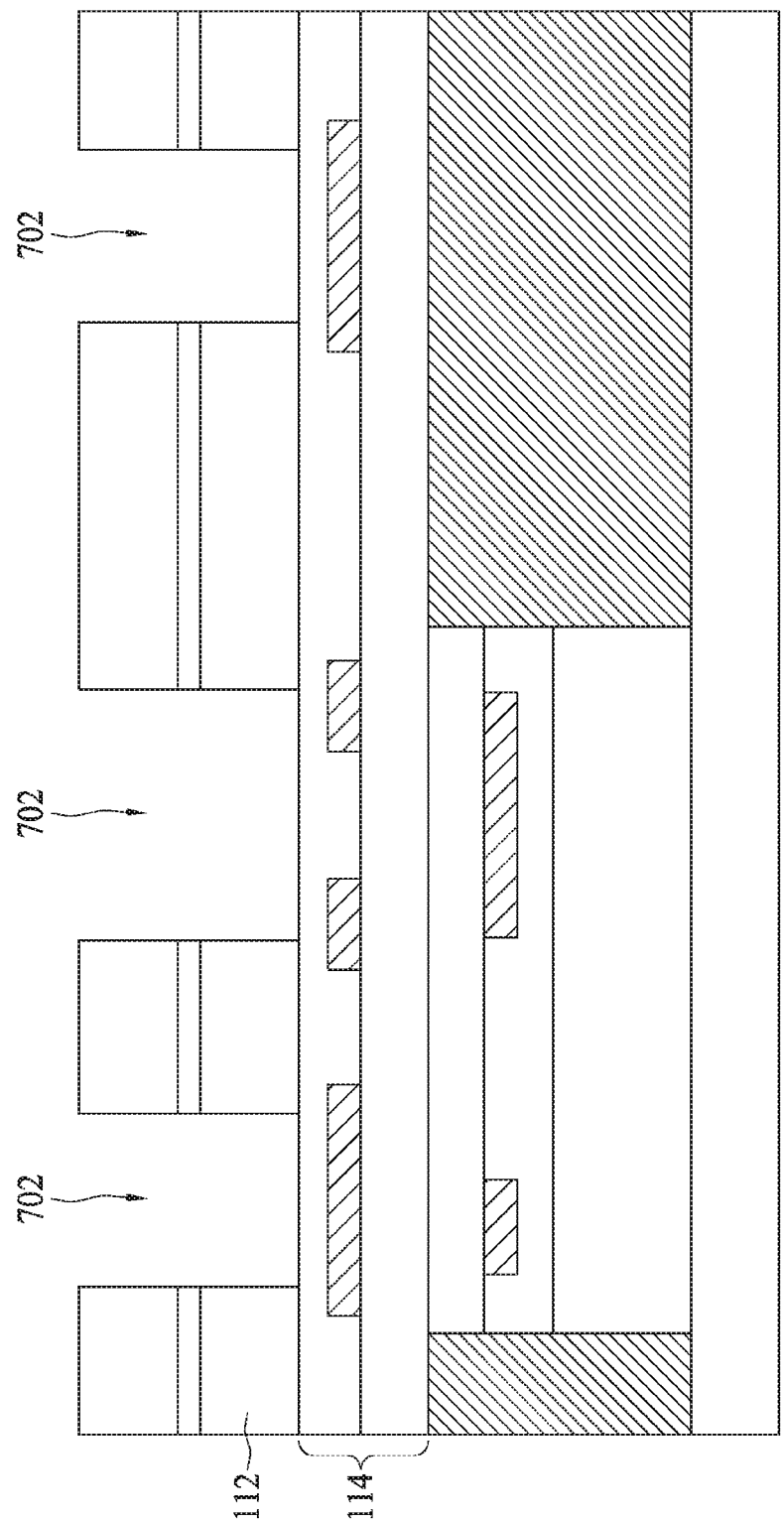

FIG. 7 is a cross-sectional view illustrating etching of the wafer substrate 112 according to an embodiment. The wafer substrate 112 is etched anisotropically to form via openings 702 with substantially vertical walls. In some embodiments, the wafer substrate 112 is etched in a separate process step from etching the etch stop layer 502, permitting the etch stop layer 502 to act as a hard mask for etching the wafer substrate 112. For example, where the wafer substrate 112 is silicon, the wafer substrate 112 is dry plasma etched with a chlorine based etchant, such as gaseous chlorine ($Cl_2$) or wet etched with potassium hydroxide (KOH) or a nitric acid/hydrofluoric acid ($HNO_3$/HF) mix. Additionally, the wafer substrate 112 is selectively etched, with the etch stopping at the wafer RDL 114.

Figure 8:
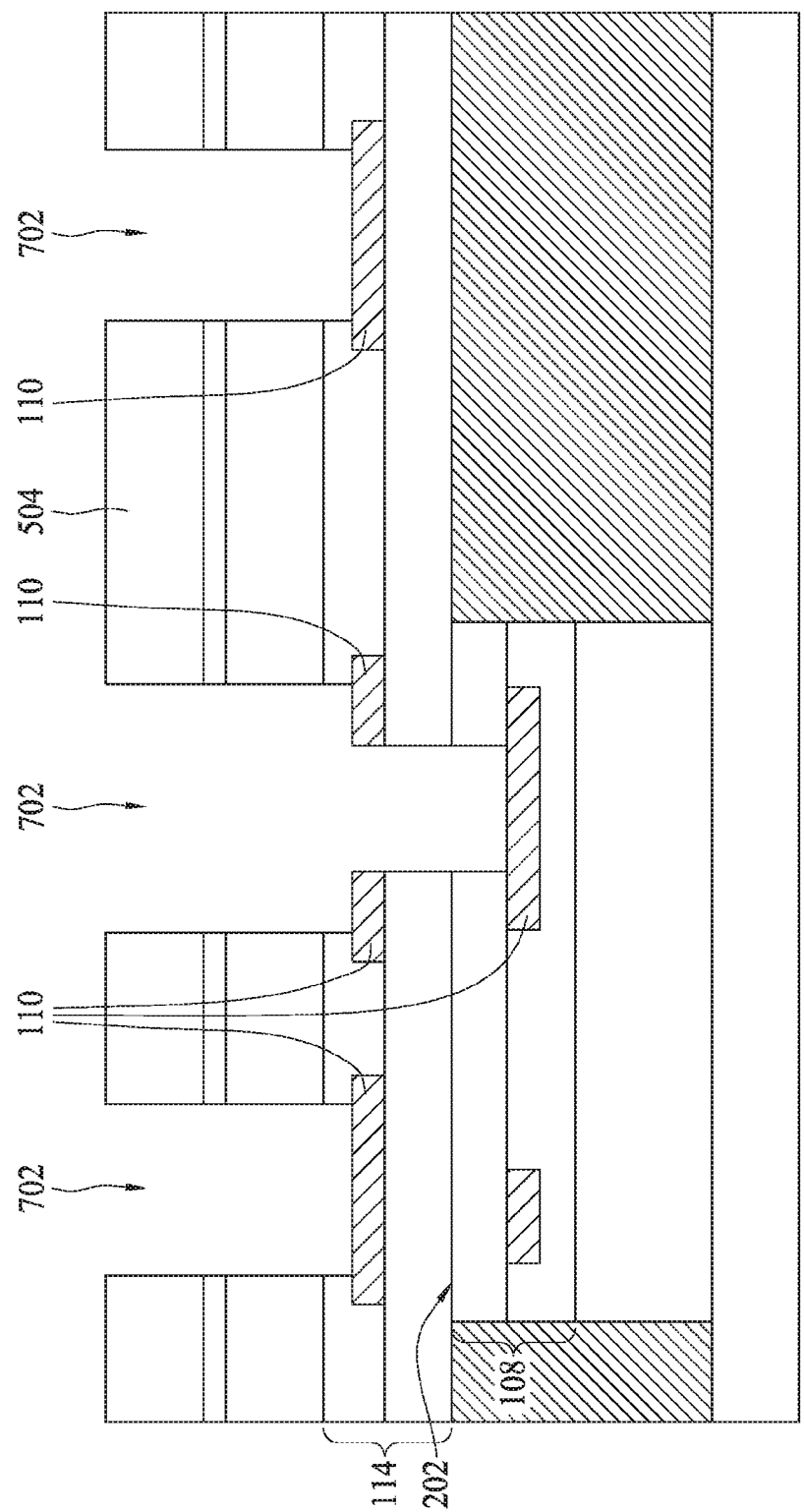

FIG. 8 is a cross-sectional view illustrating etching of the oxide layers of the RDLs 108 and 114. The oxide layers are, in an embodiment, etched using a buffered oxide etch (BOE) comprising ammonium fluoride ($NH_4F$) and hydrofluoric acid. Conductive elements 110 in the oxide layers of the RDLs 108 and 114 act as an etch stop layer, permitting etching of the RDLs 108 and 114 to different depths. Etching the oxide layers extends the via openings 702 to conductive elements 110 in the RDLs 108 and 114. In some embodiments, a via opening 702 extends through an opening in an upper conductive element 110 and exposes a surface of a lower conductive element 110. Thus, a single via opening 702 can expose surfaces of multiple conductive elements 110. Additionally, in some embodiment, the via openings 702 expose conductive elements 110 in the die RDL 108 and the wafer RDL 114.

Figure 9:
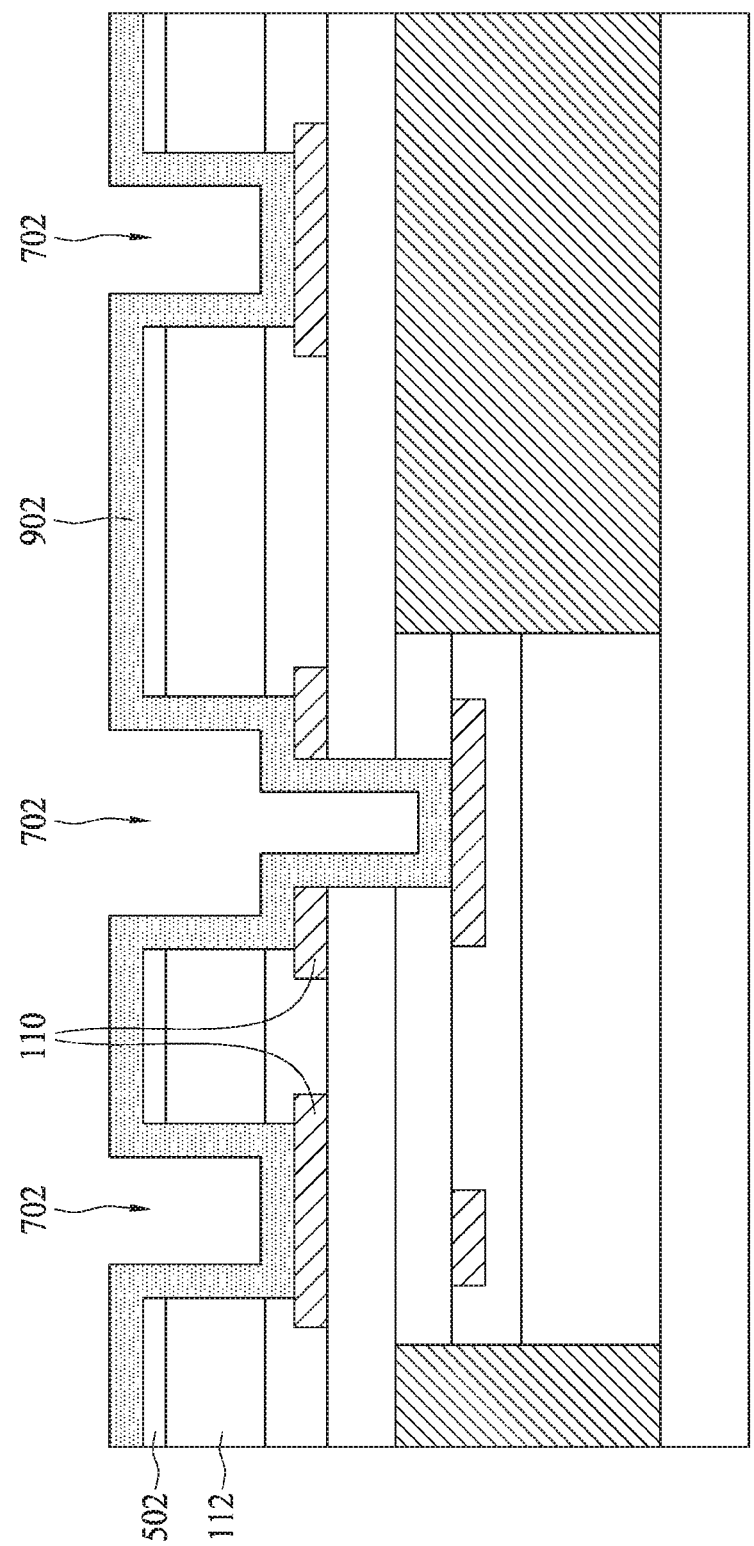

FIG. 9 is a cross-sectional view illustrating formation of an isolation layer 902 according to an embodiment. The mask 504 (see FIG. 7) is removed, and a conformal dielectric isolation layer 902 is formed over the etch stop layer 502. The isolation layer 902 extends into each of the via openings 702 and covers the sidewalls of the via openings 702, including the portions of the wafer substrate 112 exposed in the via openings 702.

In an embodiment, the isolation layer 902 is formed from silicon nitride, for example, using a CVD or PECVD process. In other embodiments, the isolation layer 902 is formed from an oxide, another nitride, a carbide, an oxynitride, spin on glass (SOG) or another dielectric or electrical insulating material. The thickness of the isolation layer 902 is determined, in part, by the intended voltage on vias that will be formed in the via openings 702. It has been determined that a thickness between about 500 angstroms and about 5000 angstroms will provide a thickness that results in a breakdown voltage that is greater than about 3.8 volts.

Figure 10:
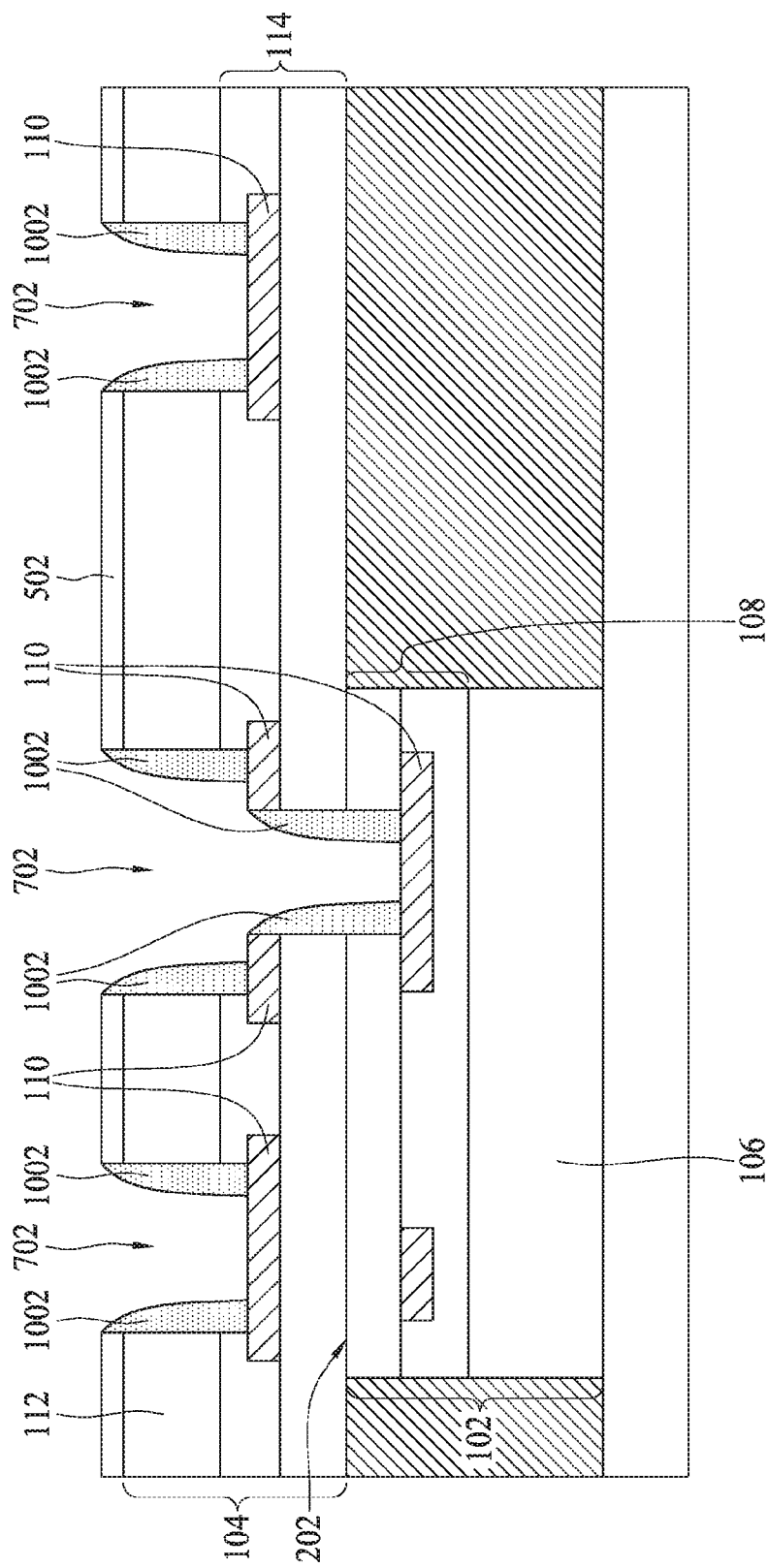

FIG. 10 is a cross-sectional view illustrating formation of self-aligning spacers 1002 according to an embodiment. The isolation layer 902 (see FIG. 9) is etched, using for example, a dry plasma etch with chlorine, sulfur hexafluoride, carbon tetrafluoride, chlorine or another etchant in an argon (Ar), helium (He) or other environment. In some embodiments, the etchant is provided with, for example, oxygen ($O_2$), nitrogen ($N_2$) or other process gasses to increase the selectivity of the etch. In such an etch, the environment is maintained between about 25° C. and about 150° C. at a pressure between about 10 mtorr and about 200 mtorr. In some embodiments, the etch is anisotropic, removing material in a vertical direction. Thus, the etch removes material of the isolation layer 902 from the horizontal surfaces of the package, leaving spacers 1002 on the sidewall surfaces of the package. For example, portions of the isolation layer 902 disposed on the etch stop layer 502 are removed while portions of the isolation layer 902 disposed on the sidewalls of the via openings 702 remain. This is due to the thickness of the isolation layer 902 in the vertical direction being greater where at the sidewalls than at the horizontal surfaces. Additionally, the portions of the top surfaces of the conductive elements 110 are exposed during the etch. This is due to the isolation material being removed substantially from the top direction, as the directional etching of the isolation layer 902 reduces the top surface of the isolation layer 902, eliminating the lateral portions of the isolation layer 902 and leaving the vertical portions.

It has been discovered that self-aligning spacers 1002 can be formed within the via openings 702, and that the self-aligning feature of the spacers 1002 causes the spacers 1002 to form on the sidewalls of the via openings 702. The spacers 1002 insulate the material forming the sidewalls of the via openings 702 from vias formed in the via openings 702. In particular, the spacers 1002 form on the sidewalls of the via openings 702 where the via opening 702 passes through the wafer substrate 112, with the outer surfaces of the spacers 1002 disposed on the sidewalls of the via openings 702, and with the inner surfaces of the spacers 1002 facing the interior of the via openings 702. The spacers 1002 permit a conductive via to be formed in the via opening 702 while avoiding electrical contact with the vertical surfaces of the wafer substrate 112 and RDLs 108 and 114. In some embodiments, the spacers 1002 extend to an underlying conductive feature 110, shielding the via opening 702 from all of the sidewalls of the via openings 702. Additionally, the spacers 1002 leave portions of the lateral surfaces of the conductive elements 110 exposed in the via openings 702 so that a subsequently formed via can come into electrical contact with the conductive elements 110. Thus, some of the spacers extend below the bottommost surface of the wafer substrate 112 into the RDLs 108 and 114, with the inner surfaces of the spacers 1002 extending contiguously from the conductive element 1002 to the top surface of the wafer substrate 112, or over the top surface of the wafer substrate.

In some embodiments where a via opening 702 is formed over or through an upper conductive element 110 to a lower conductive element 110, the via opening 702 has an upper portion with a wider width than a lower portion of the via opening 702. In such an embodiment, separate spacers 1002 are formed on the sidewalls of the upper and lower portions of the via openings 702, with the upper and lower spacer 1002 laterally spaced apart to expose the lateral surfaces of the upper conductive element 110.

Figure 11:
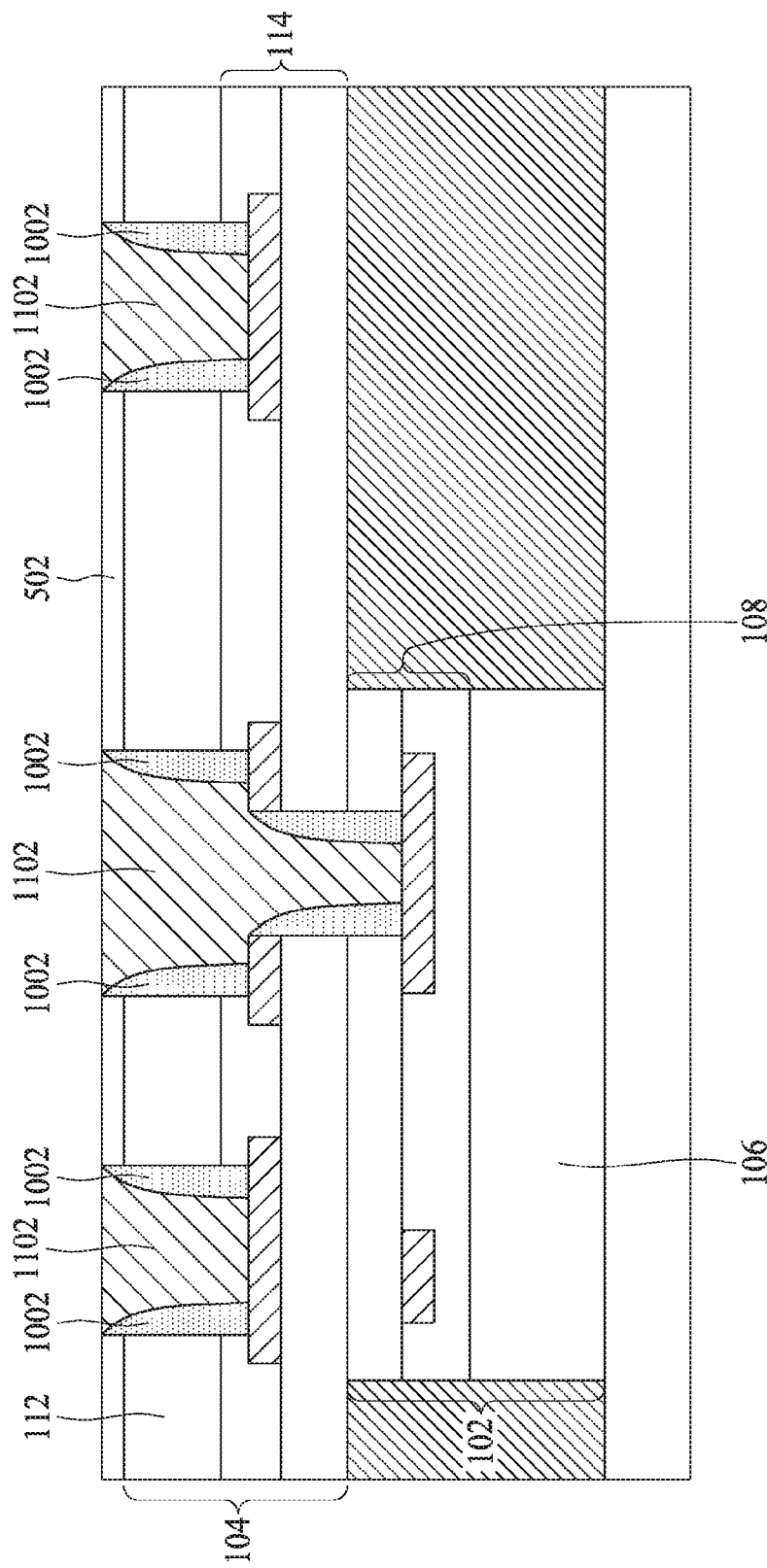

FIG. 11 is a cross-sectional view illustrating formation of vias 1102 in the via openings 702 according to an embodiment. As the vias 1102 are formed after bonding the die 102 to the wafer 104, this process is referred to as a via last process. In some embodiments, vias 1102 that extend through a substrate such as the wafer substrate 112 are referred to as through substrate vias (TSVs) or alternatively, as through silicon vias for vias extending through a silicon substrate. Vias 1102 that extend through the molding compound 302 are referred to as through dielectric vias (TDVs).

In some embodiments, a barrier layer (not shown for clarity) is formed in the via openings 702, with the barrier layer formed from, for example, cobalt (Co), tantalum, tungsten, tantalum nitride (TaN), titanium nitride (TiN), or the like by CVD, PECVD or another deposition process. Vias 1102 are created by filling the via openings 702 with a conductive material such as copper (Cu) aluminum (Al), aluminum copper alloy (AlCu), gold, titanium, cobalt, an alloy, or another conductive material. In some embodiments, the vias are formed through, for example, electrochemical plating (ECP), electroplating, electroless plating or another process. In such embodiments, a seed layer (not shown) is formed over the barrier layer or over the spacers and conductive elements 110 by for example, atomic layer deposition. The seed layer provides nucleation sites for the plating process and increases the uniformity of the plated material that forms the vias 1102. In some embodiments, the conductive material of the vias 1102 extends over the via openings 702. Such overfilling is used, for example, to ensure that the openings 702 are completely filled. Excess material is removed by grinding, CMP, polishing, etching or another reduction process. After formation of the vias 1102, the top surfaces of the vias 1102 are substantially planar with the top surface of the etch stop layer 502. In some embodiments, the grinding process removes the etch stop layer 502 or reduces the top surface of the wafer substrate 112.

The vias 1102 extend through the wafer substrate 112 to contact one or more conductive elements 110. The spacers 1002 electrically insulate the vias 1102 from the wafer substrate 112 so that electrical signals sent through the vias 1102 do not interfere with active devices in the wafer substrate 112. In some embodiments, a via 1102 extends through the wafer substrate 112, the wafer RDL 114, and bond interface 202 to contact a conductive element 110 in the die RDL 108. In such an embodiment, the conductive element 110 on the die RDL 108 is electrically connected to the die substrate 106 through the die RDL 108. Thus, a connection between the die substrate 106 and an external device or connection may be formed from the wafer side of the package. Similarly, in some embodiments, a via 1102 extends through the wafer substrate 112 and contacts a conductive element 110 in the wafer RDL 114 that is electrically connected to the wafer substrate 112. Thus, power or data connections can be provided from the die 102 or wafer 104 through the wafer substrate 112 to an external device.

Additionally, in some embodiments, the wafer 104 can be electrically connected to the die 102 using the via last process. For example, a first conductive element 110 in the wafer RDL 114 and a second conductive element 110 in the die RDL 108 can be connected by a via 1102 that contacts both the first and second conductive elements 110. Thus, even though the RDLs 108 and 114 are between the die 102 and wafer 104, external electrical connectivity and die-to-wafer connectivity can be provided without discrete connectors such as microbumps or solder balls formed prior to bonding the die 102 to the wafer 104. Additionally, the via last process eliminates the requirements for aligning the wafer to the die during the die-to-wafer bonding process.

It has been discovered that the spacers 1002 provide a lower cost and simpler structure for chip-on-wafer structures. Additionally, the spacers 1002 permit a height-to-width aspect ratio for the vias that is between 3 and about 10, increasing the density of inter-chip connections. It has been further discovered that, with the vias 1102 extending through the wafer substrate 112, the vias 1102 can be arranged through the package more regularly and provide a more heterogeneous chip stack. The regular arrangement of the vias 1102 also provides improved warpage control during subsequent processing or package mounting.

Figure 12:
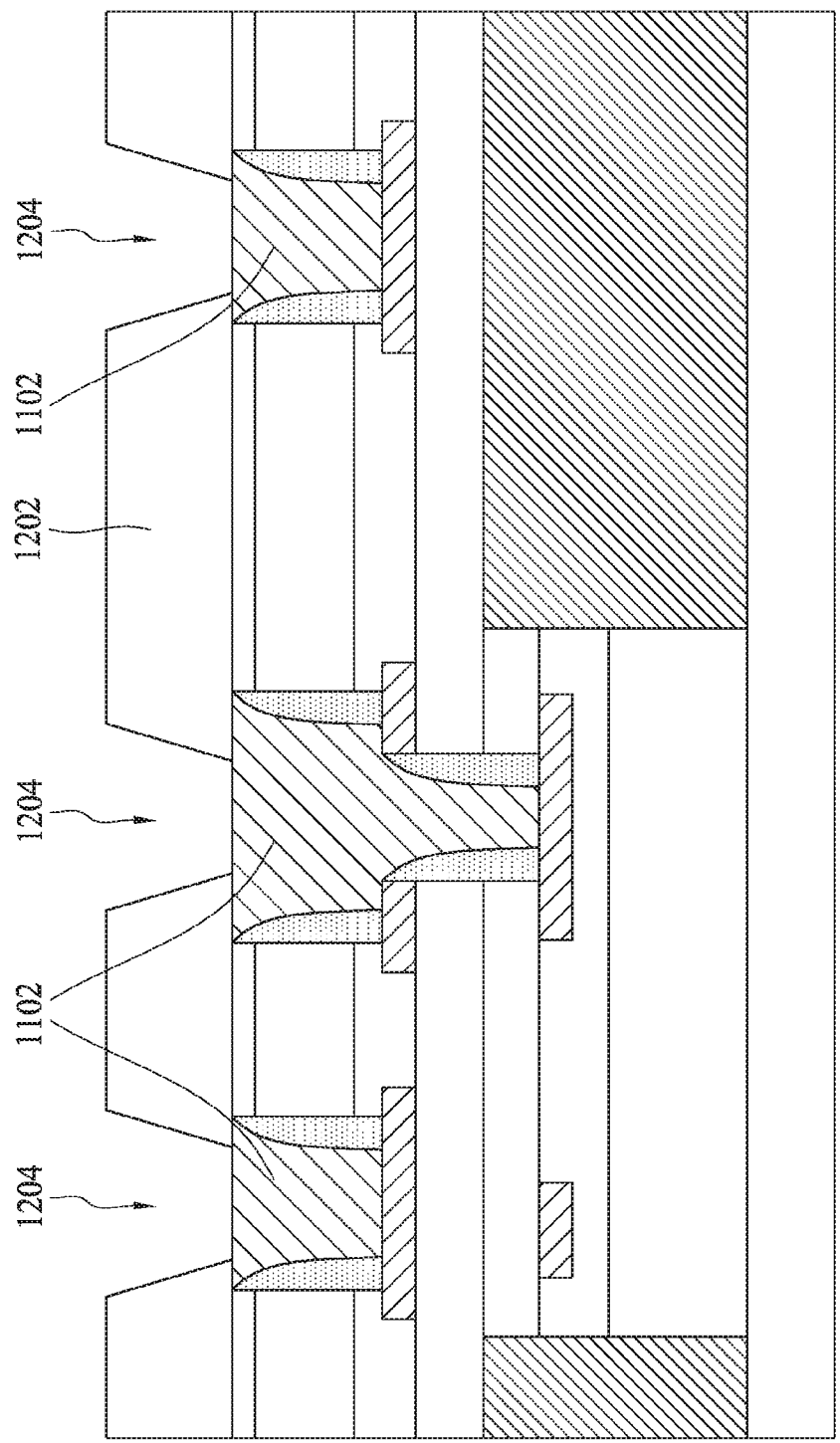

FIG. 12 is a cross-sectional view illustrating a top RDL insulating layer 1202. In some embodiments, an insulating material such as PBO, silicon oxide, polyimide, or another insulating material is formed over the etch stop layer 502. One or more RDL openings 1204 are formed in the insulating layer 1202 exposing the vias 1102. In some embodiment, insulating layer 1202 is PBO that is sprayed on or spun on, and the RDL openings 1204 are formed by exposing and developing the PBO with a photolithographic process. In other embodiments, the insulating layer 1202 is deposited by CVD or the like and etched, laser drilled, milled, or otherwise patterned.

Figure 13:
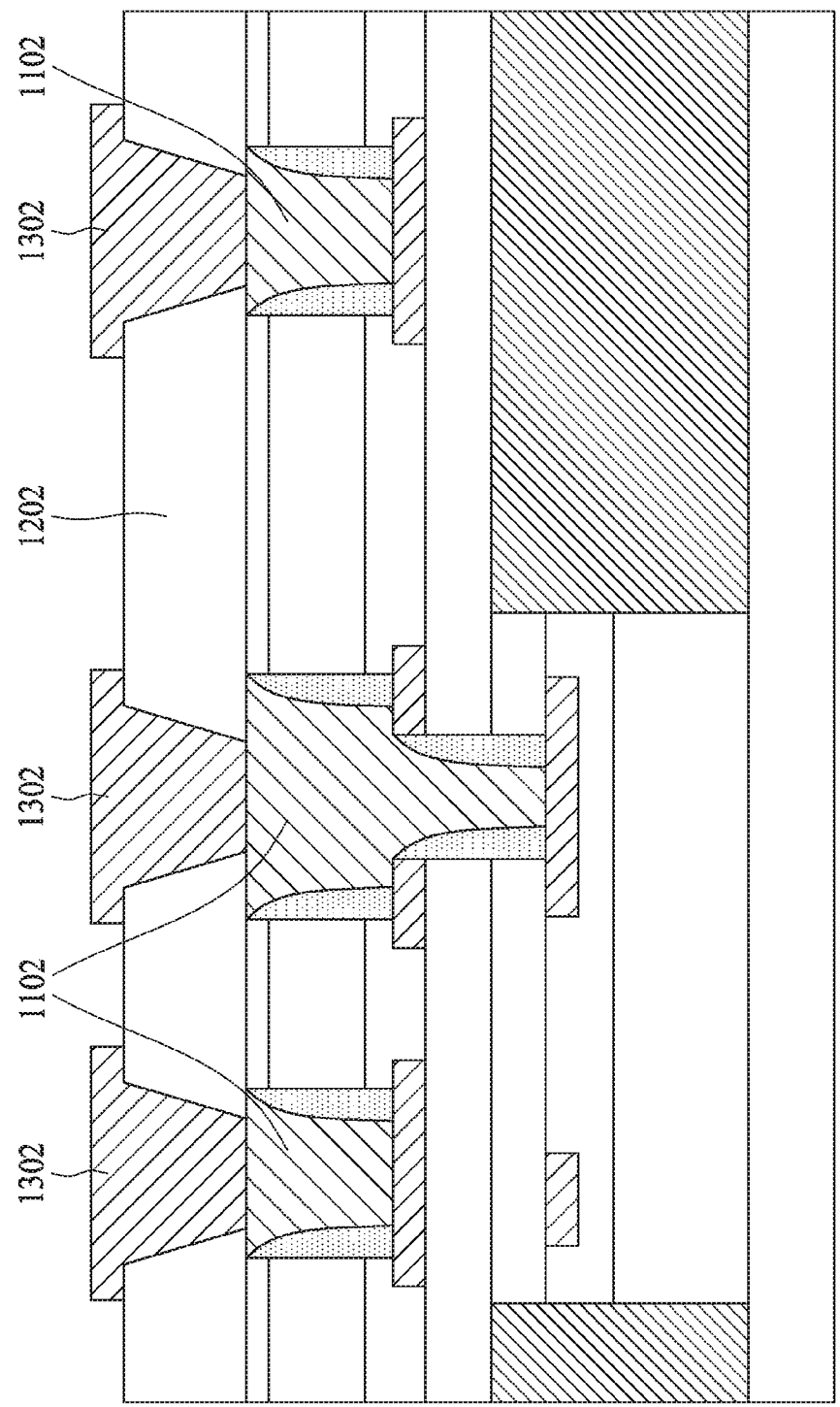

FIG. 13 is a cross-sectional view illustrating formation of top RDL conductive elements 1302 in the top RDL insulating layer 1202 according to an embodiment. A conductive material, such as copper, is deposited over the insulating layer 1202 in the RDL openings 1204 through, for example, sputtering, PVD, CVD, plating or another deposition process. The deposited conductive material is patterned by masking and etching or by masking prior to deposition. While the illustrated top RDL conductive elements 1302 are shown extending substantially vertically for clarity, it should be understood that in some embodiments, the top RDL conductive elements 1302 have portions that extend laterally to provide a desired layout for subsequently formed layers or connectors.

Figure 14:
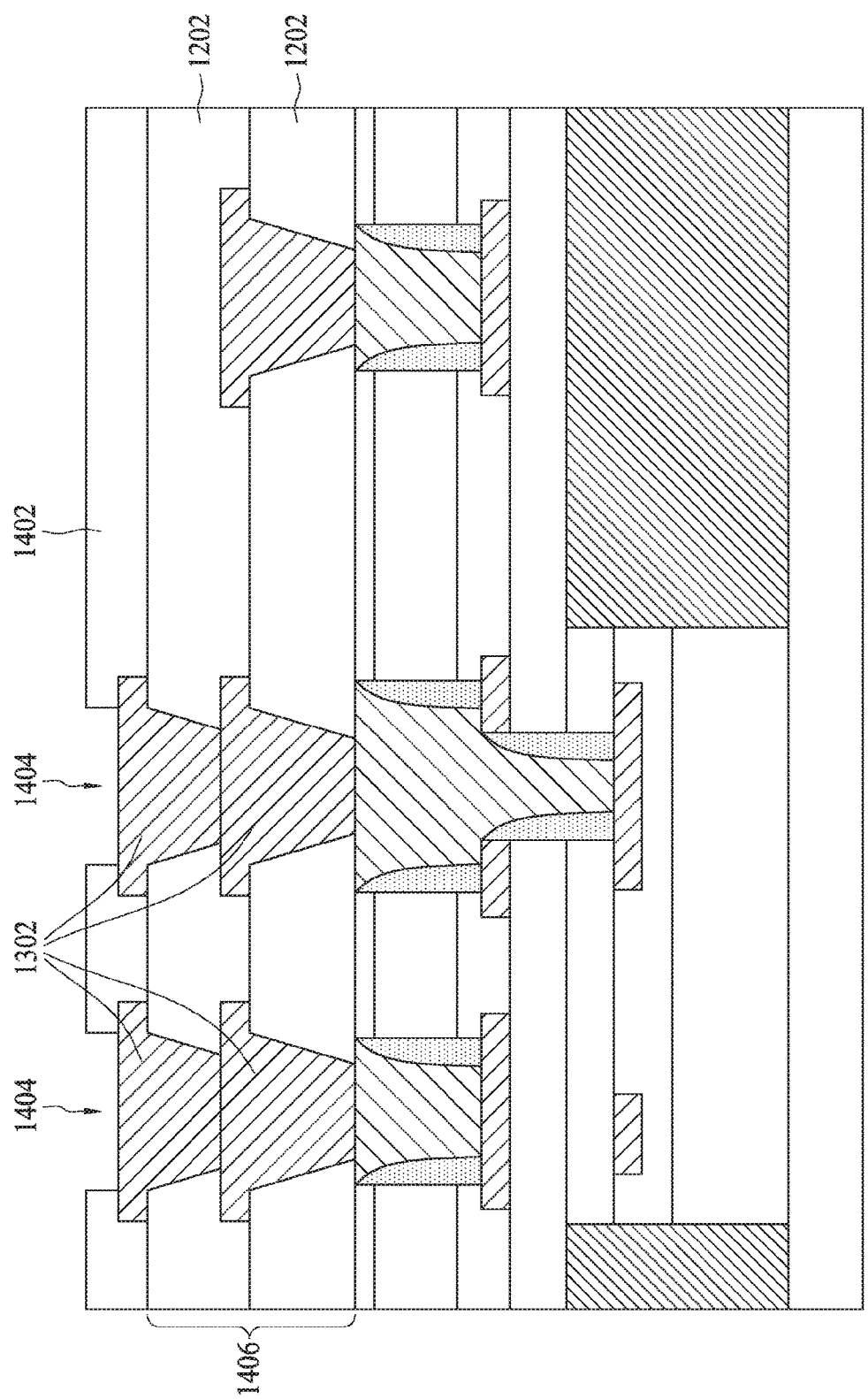

FIG. 14 is a cross-sectional view illustrating formation of additional insulating layers and conductive elements to form the top RDL 1406. One or more top RDL insulating layers 1202 with conductive elements 1302 are formed in a stack to provide electrical connectivity between external devices and the vias 1102. Additionally, a protective layer 1402 is formed over the uppermost top RDL insulating layer 1202 and has openings exposing the top RDL conductive elements 1302. In some embodiments, the protective layer 1402 is PBO, an epoxy, an oxide, a nitride, a carbide, an oxynitride, a polyimide, or another insulating or protective material and is deposited and patterned as described above.

Figure 15:
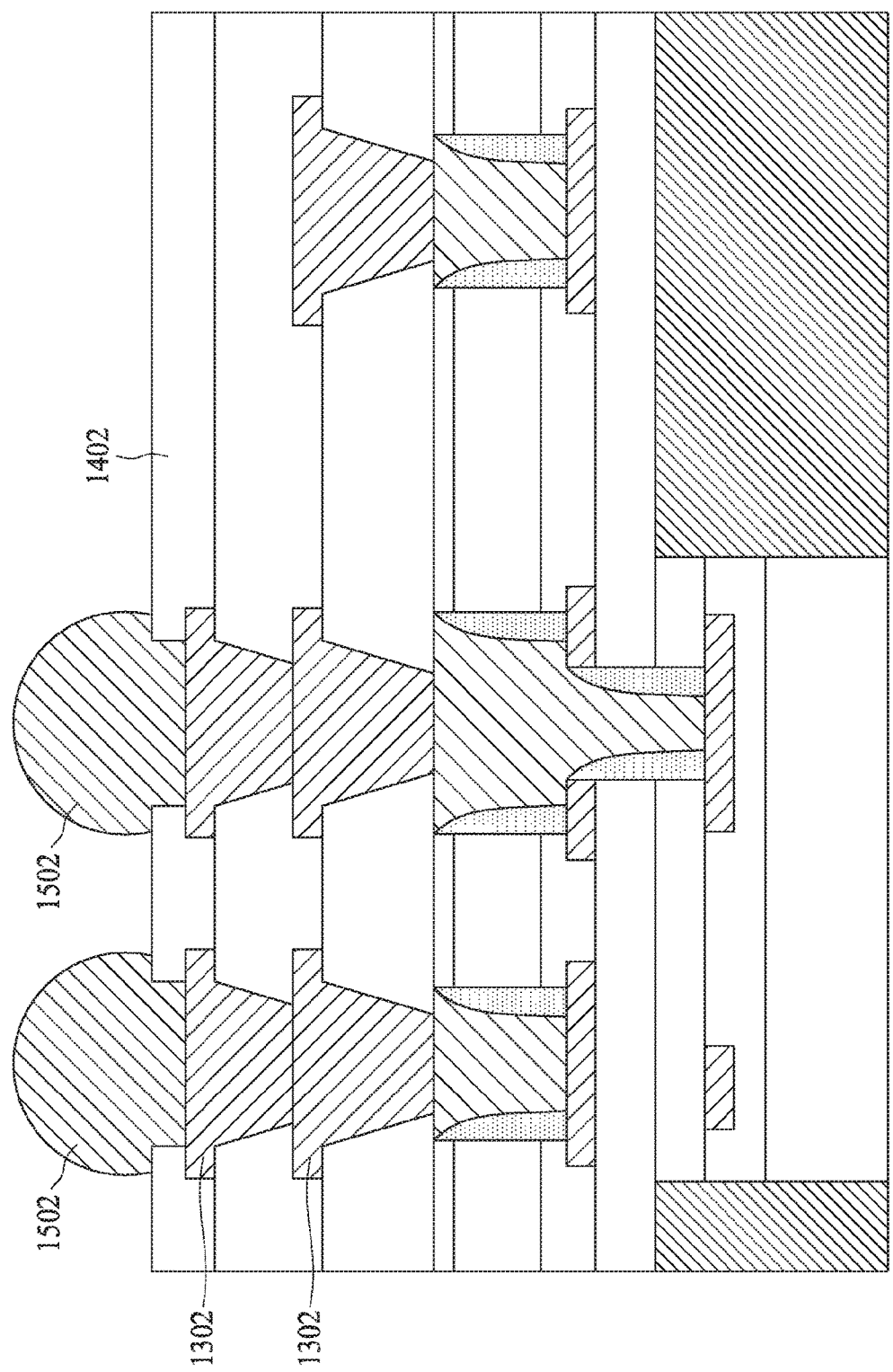

FIG. 15 is a cross-sectional view illustrating formation of connectors 1502 according to an embodiment. One or more connectors 1502 are mounted on exposed portions of the top RDL conductive elements 1302. In some embodiments, the connectors 1502 are solder balls, pillars, conductive bumps or another conductive connector. The connectors 1502 are configured to permit mounting of the package to a target substrate such as a die, package, wafer, PCB or the like. Thus, the wafer 104 and die 102 would be in signal connectivity with the target substrate through the connectors 1502 and vias 1102. The carrier 402 then removed from the package.

While the chip-on-wafer package is shown using the via last process to form vias 1102 that extend from the wafer side of the package through the wafer substrate 112 to the RDLs 108 and 114, it should be understood that the disclosed embodiments are not limited to such an arrangement. In other embodiments, vias 1102 are formed from the die side of the package through the die substrate 106 and molding compound 302 to the RDLs 108 and 114. Additionally, in some embodiments, the vias 1102 are formed from both the wafer side and die side of the package.

Additionally, the embodiments disclosed above are not limited to the order of steps and structure described above. FIGS. 16 through 20 illustrate cross-sectional views of intermediate processing steps in forming a chip-on-wafer structure having partial height self-aligning spacers according to an embodiment.

Figure 16:
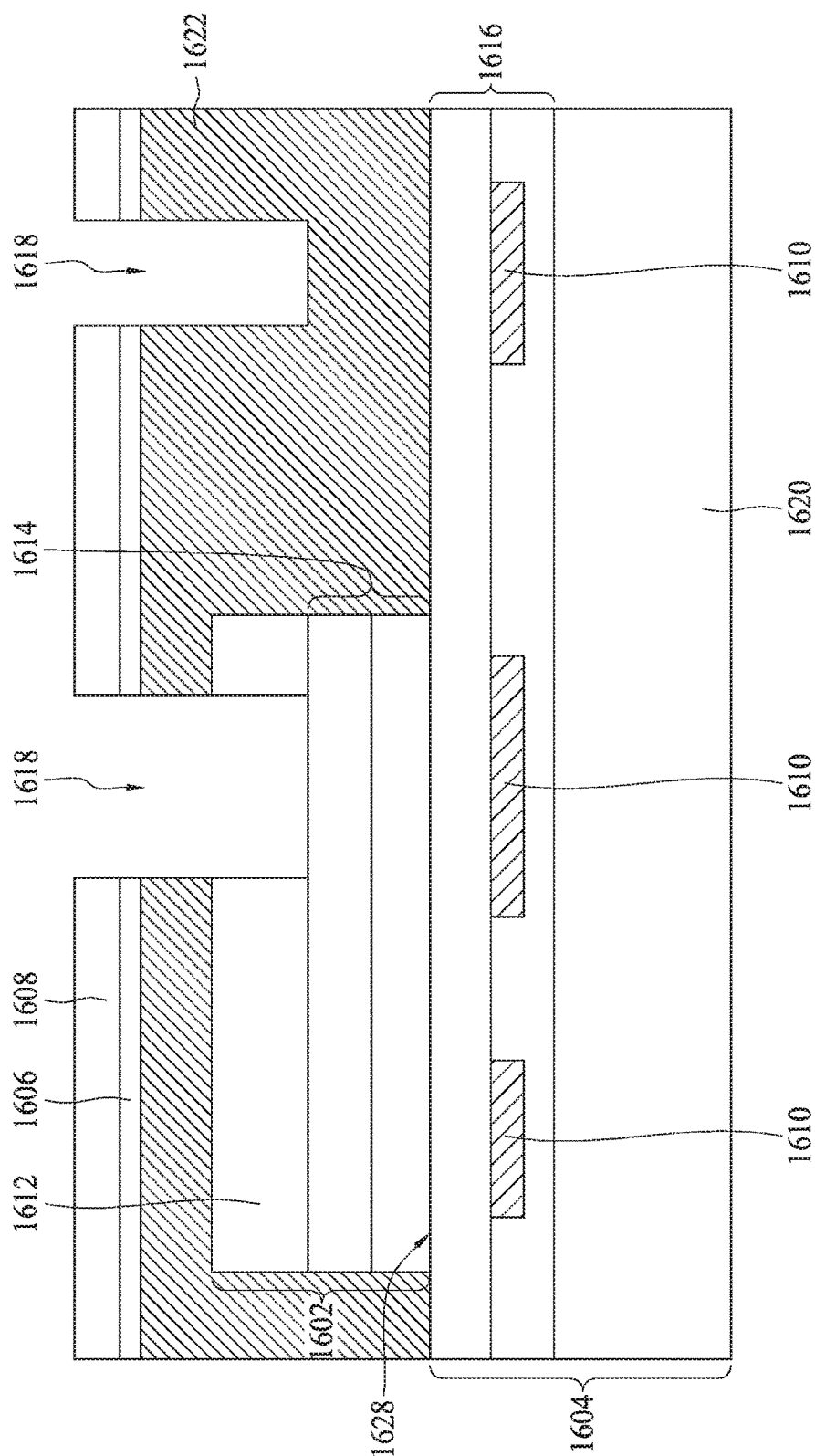
FIGS. 16-20 illustrate cross-sectional views of intermediate processing steps in forming a chip-on-wafer structure using via last process according to another embodiment.

FIG. 16 illustrates a cross-sectional view of masking and etching via openings 1618 in a molding compound 1622 of a package according to an embodiment. A die 1602 and wafer 1604 are bonded, for example, as described above. The die 1602 and wafer 1604 have a die substrate 1612 and wafer substrate 1620, respectively, and the substrates 1612 and 1620 have one or more active devices. A die RDL 1614 and wafer RDL 1616 are disposed on the respective substrates 1612 and 1620 and comprise dielectric layers with conductive elements 1610 disposed therein, some of which are in contact with the active devices in the respective substrates 1612 and 1620. The die 1602 and wafer 1604 are bonded together so that the die RDL 1614 and wafer RDL 1616 are in contact and form a bond interface 1628. In some embodiments, the die 1602 and wafer 1604 are bonded with a direct surface, metal-to-metal or hybrid bond as described above. The molding compound 1622 is formed over the die 1602, and in some embodiments, extends over the die 1602. An etch stop layer 1606 is formed over the molding compound 1622.

A mask 1608 is deposited over the etch stop layer 1606 and patterned with openings disposed over one or more of the conductive elements 1610. Via openings 1618 are etched through the molding compound 1622 using the mask 1608 to control the location of the via openings 1618. In an embodiment, the via openings 1618 extend through the molding compound 1622, and via openings 1618 disposed over the die substrate 1612 extend through the die substrate 1612 to the die RDL 1614. The via openings 1618 that are adjacent to, and not disposed over, the die substrate 1612 extend partially through the molding compound 1622.

Figure 17:
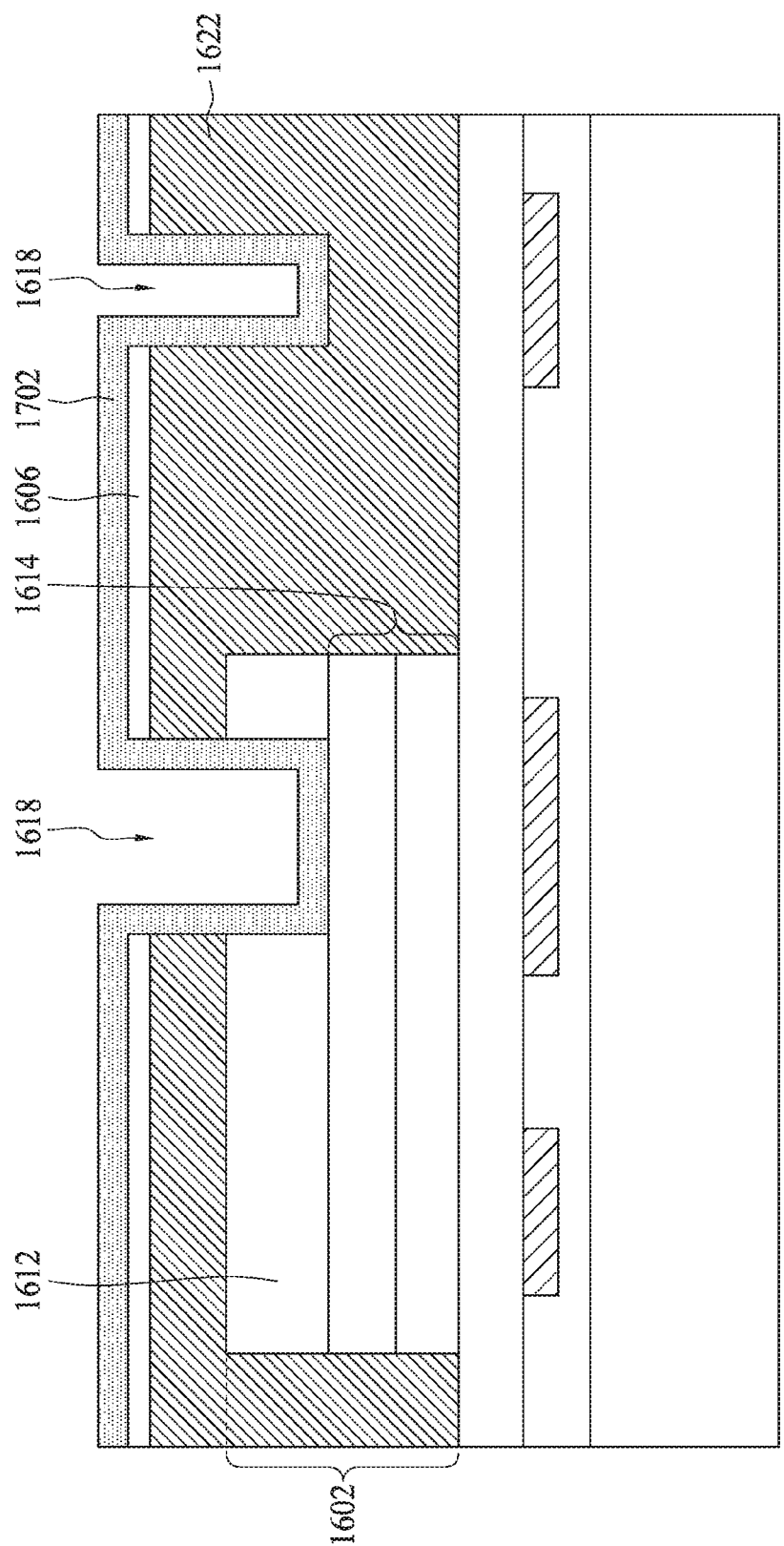

FIG. 17 is a cross-sectional view illustrating formation of an isolation layer 1702 according to an embodiment. The mask 1608 (see FIG. 16) is removed, and a conformal dielectric isolation layer 1702 is formed over the etch stop layer 1606. In an embodiment, the isolation layer 1702 is formed as described above. The isolation layer 1702 extends into each of the via openings 1618 and covers the sidewalls of the via openings 1618, including the portions of the die substrate 1612 exposed in the via openings 1618. Additionally, the isolation layer 1702 covers the lateral surfaces of, for example, the die RDL 1614 and the molding compound 1622 that are exposed at the bottoms of the openings 1618.

Figure 18:
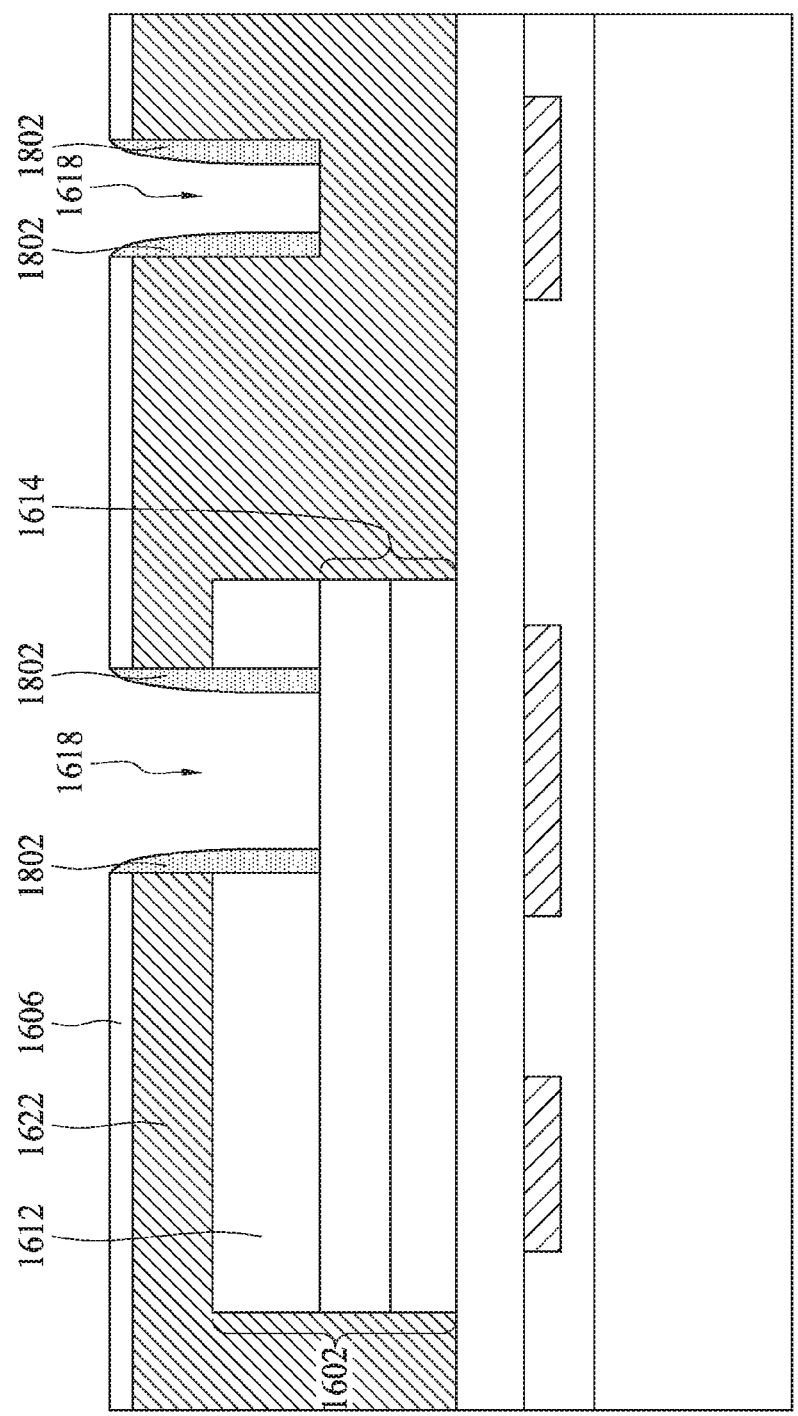

FIG. 18 is a cross-sectional view illustrating formation of partial height self-aligning spacers 1802 according to an embodiment. The isolation layer 1702 (see FIG. 17) is etched, in some embodiments, as described above. The etch exposes portions of the lateral surfaces of the die RDL 1614 in the via openings 1618 between the spacers 1802. Additionally, for the via openings 1618 that are adjacent to, and not disposed over, the die RDL 1616, the etch exposes the molding compound 1622 surface that forms the bottom of the via openings 1618.

Figure 19:
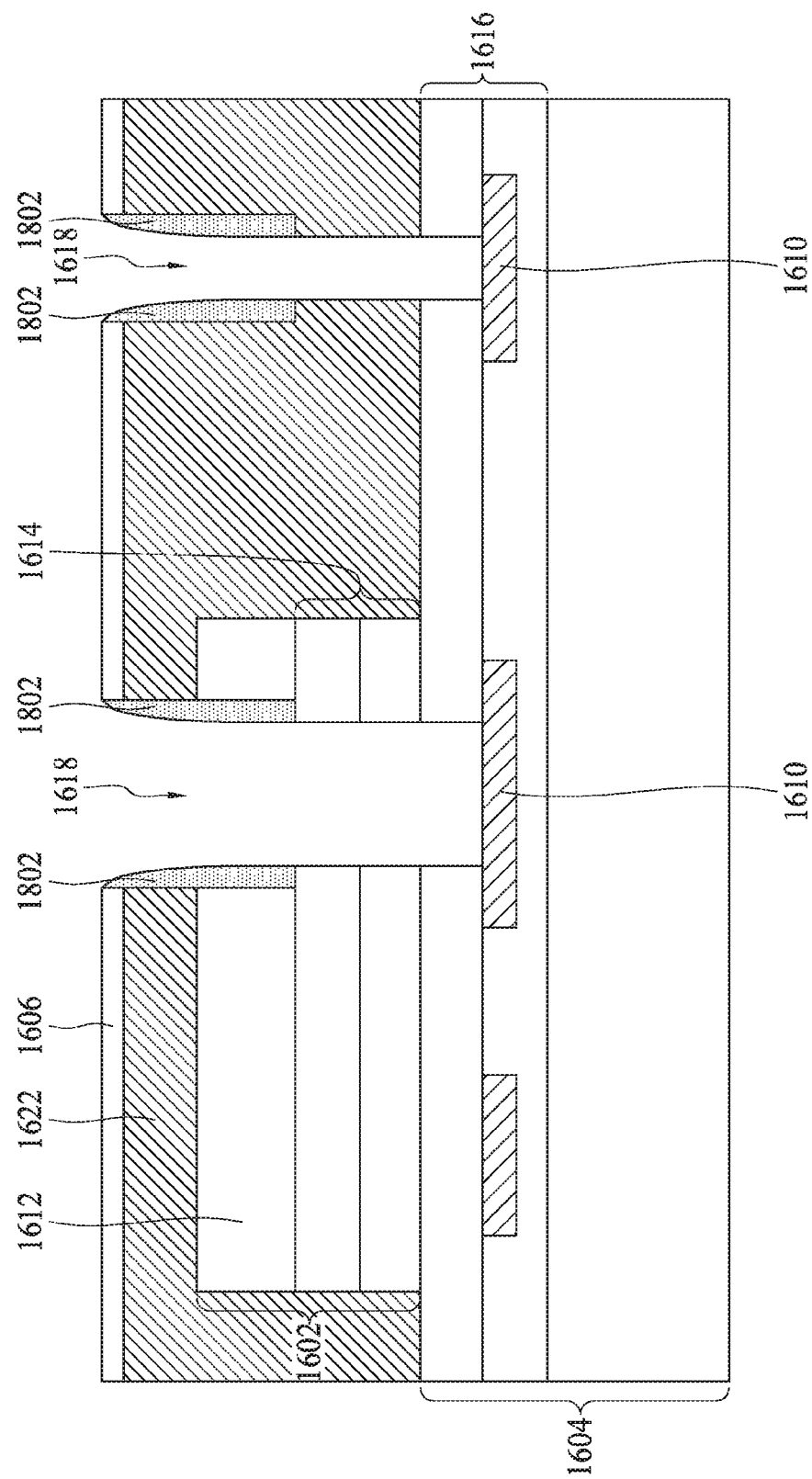

FIG. 19 illustrates a cross-sectional view of a second etch after formation of the spacers 1802 according to an embodiment. In some embodiments, the isolation layer 1702 a selectively etched as described above with respect to FIG. 8. The via openings 1618 are extended to underlying conductive elements 1610 in the RDLs 1614 and 1616, exposing an upper surface of the conductive elements 1610. In such an embodiment, the spacers 1802 extend only partially through the via openings 1618, with bottom surfaces of the spacers 1802 disposed on the die RDL 1614 or within the molding compound 1622. However, the spacers 1802 are disposed in the via openings 1618 on the sidewalls of the die substrate 1612, electrically insulating the die substrate 1612 from the via openings 1618 and subsequently formed vias. It has been discovered that the partial height self-aligning spacers 1802 permit etching of both the die RDL and the RDLs 1614 and 1616 with a single mask. The spacers 1802 mask the sidewalls of the die RDL 1614 during the second etch. The resulting via openings 1618 have a lower portion with sidewalls that are substantially planar, level, even or aligned with the inner surfaces of the spacers 1802. In some embodiments where the molding compound 1622 extends over the top surface of the die substrate 1012, the spacers 1802 extend from about the bottom surface of the die substrate 1612 to, or above, the top surface of the molding compound 1622.

Figure 20:
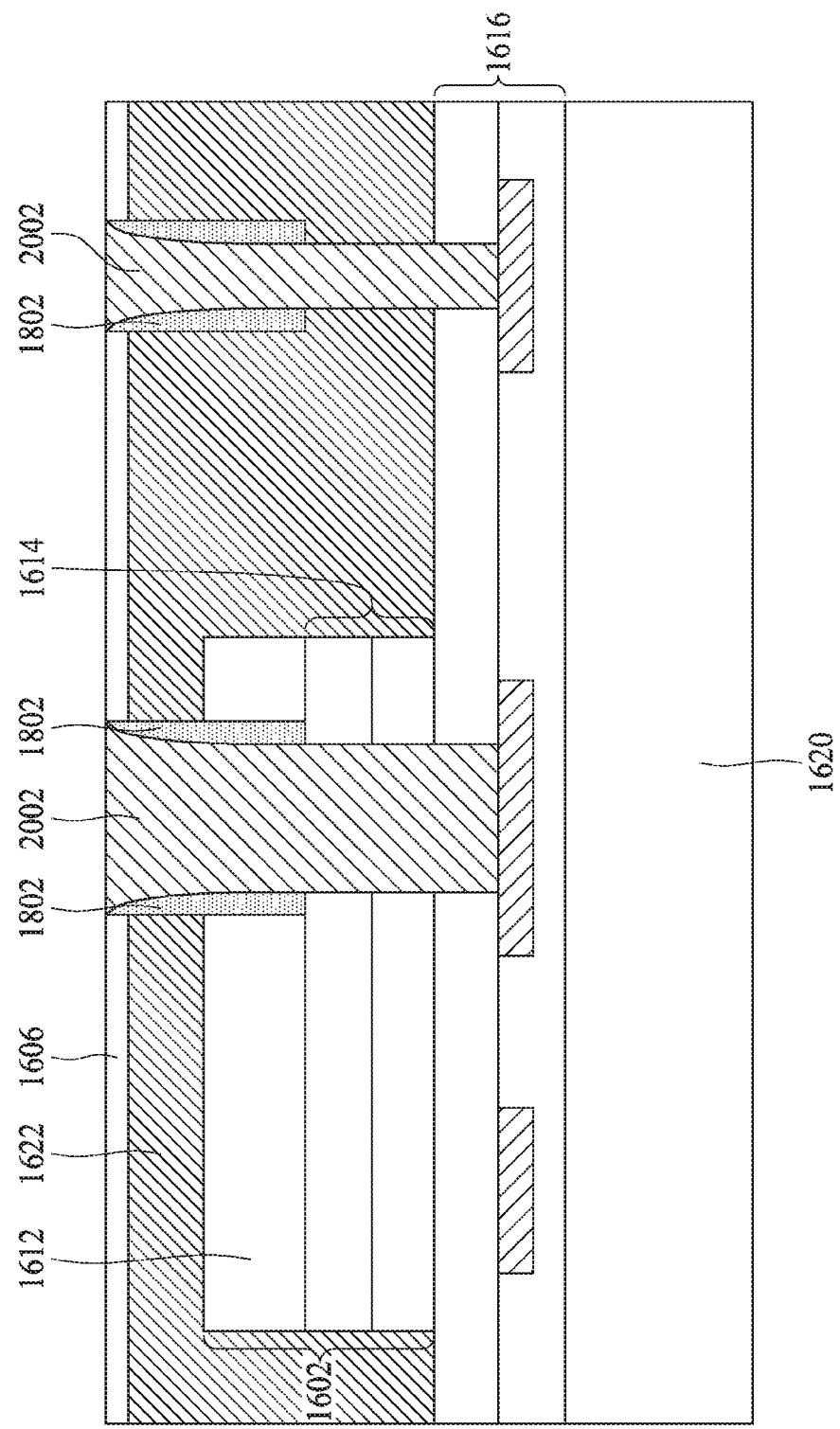

FIG. 20 illustrates a cross-sectional view of formation of the vias 2002 according to an embodiment. In some embodiments, vias 2002 are formed in the via openings 1618 (see FIG. 17) as describe above with respect to FIG. 11. The vias 2002 are insulated from the die substrate 1612 by the spacers 1802, and extend from the top surface of the package through the die substrate 1612 to conductive elements 1610 in the RDLs 1614 and 1616.

While the described embodiments is illustrated as having a partial height spacer 1802 insulating the vias 2002 from the die substrate 1612, the embodiments are not limited to those described. For example, in some embodiments, the partial height spacers 1802 are disposed in the wafer substrate 1620, with the vias 2002 extending to the RDLs 1614 and 1616 from the wafer side of the package.

Figure 21:
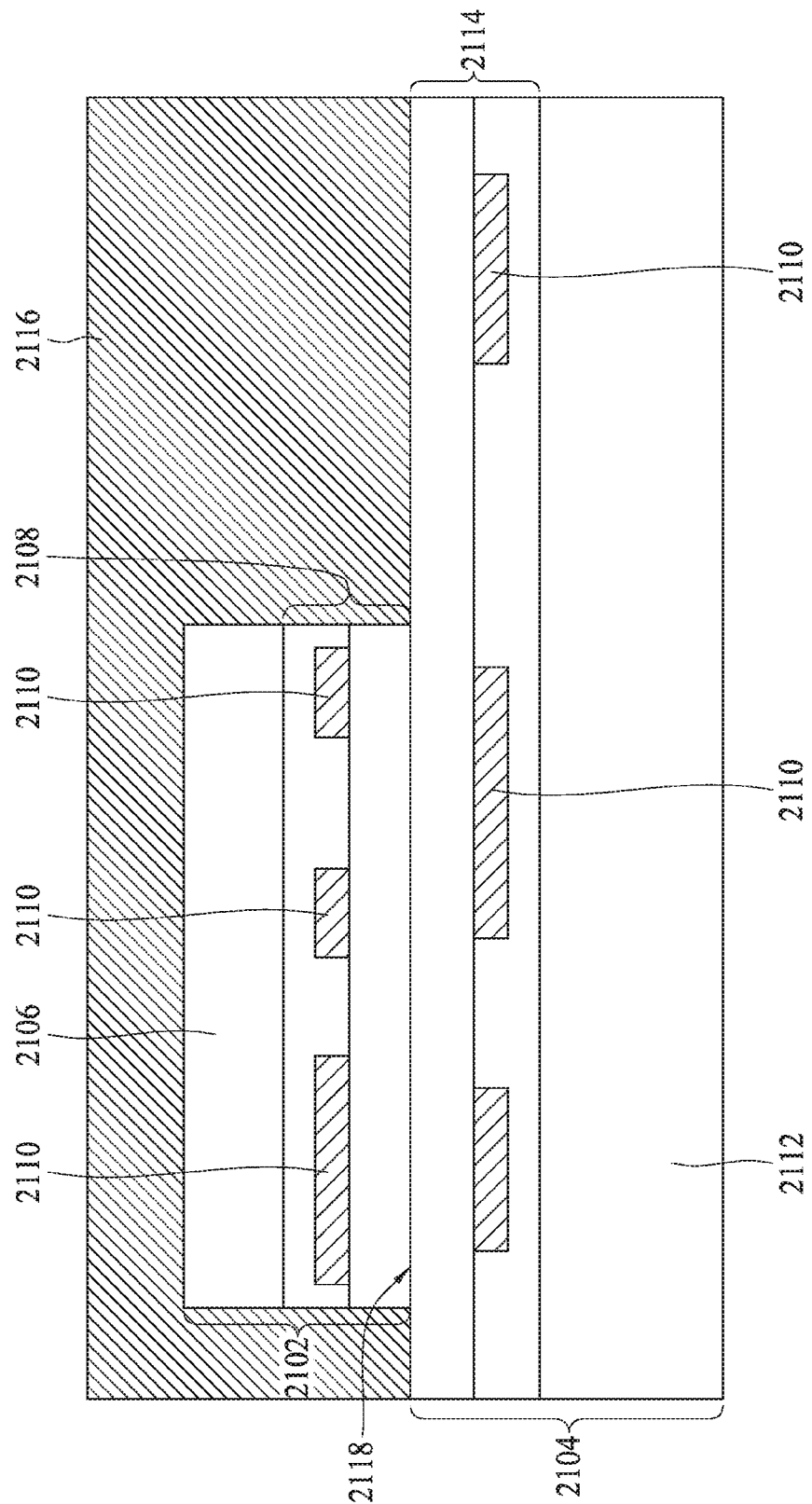
FIGS. 21-29 illustrate cross-sectional views of intermediate processing steps in forming a chip-on-wafer structure using a dual damascene via last process according to an embodiment.

FIGS. 21 through 29 illustrate cross-sectional views of intermediate processing steps in forming a chip-on-wafer structure using a dual damascene via last process according to an embodiment. FIG. 21 illustrates a cross-sectional view of formation of a molding compound 2116 over a die 2102 bonded to a wafer 2104 according to an embodiment. The die 2102 and wafer 2104 have, respectively, a die substrate 2106 and wafer substrate 2112 having one or more active devices. A die RDL 2108 and wafer RDL 2114 are disposed on the respective substrates 2106 and 2112 and comprise dielectric layers with conductive elements 2110 disposed therein, some of which are in contact with the active devices in the respective substrates 2106 and 2112. The die 2102 and wafer 2104 are bonded as described above so that the die RDL 2108 and wafer RDL 2114 are in contact and form a bond interface 2118. The molding compound 2116 is formed over the die 2102 and wafer 2104 as described above, and in some embodiments, extends over the die 2102.

Figure 22:
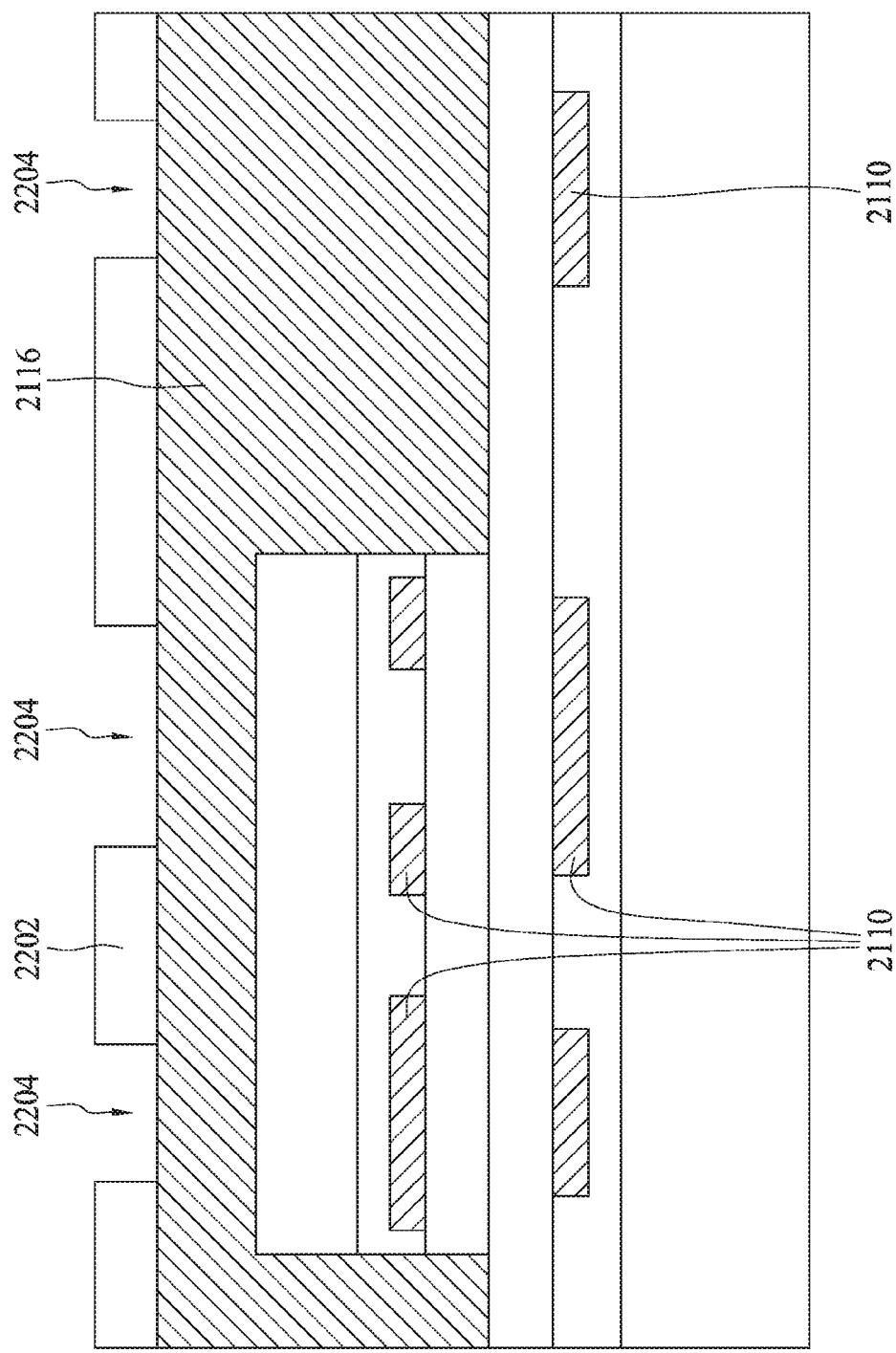

FIG. 22 illustrates a cross-sectional view of forming a first mask 2202 on the package according to an embodiment. In such an embodiment, the first mask 2202 is formed over the molding compound 2116 and is patterned to form openings 2204. The first mask 2202 is, in some embodiments, a photoresist that is deposited, exposed and developed. The openings 2204 in the first mask 2202 are aligned over conductive elements 2110 in the RDLs 2108 and 2114. It has been discovered that a dual damascene technique for forming via openings permits the elimination of an etch stop layer and associated etch of the etch stop layer. In such an embodiment, the first mask 2202 is disposed on the molding compound 2116.

Figure 23:
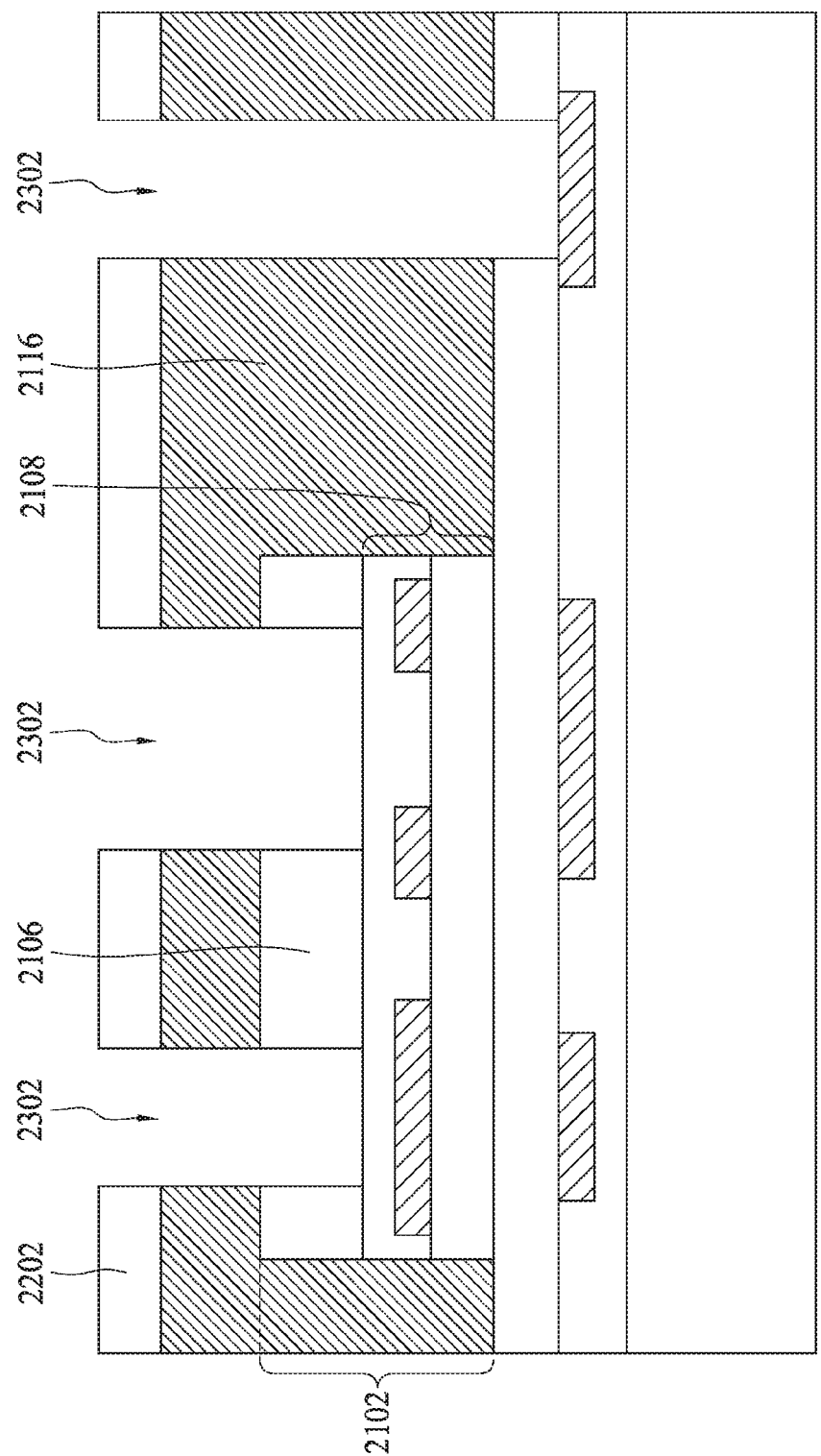

FIG. 23 illustrates a cross-sectional view of etching the die substrate 2106 according to an embodiment. Via openings 2302 are formed through the molding compound 2116, and through the die substrate 2106 to expose the die RDL 2108. In an embodiment, the via openings 2302 are etched as described above. Via openings 2302 that are adjacent to, and not disposed over, the die substrate 2106 extend partially through the molding compound 2116.

Figure 24:
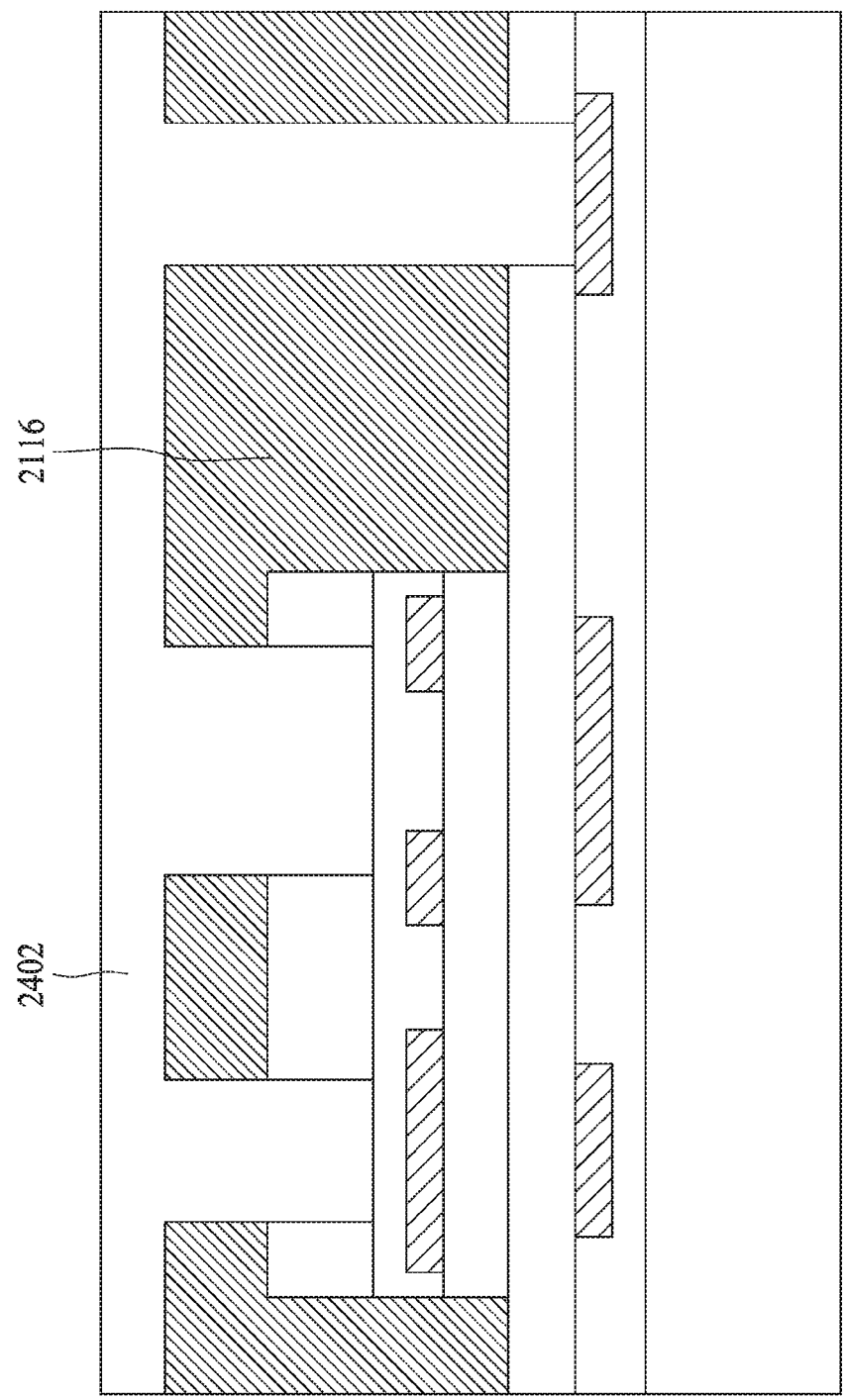

FIG. 24 illustrates a cross-sectional view of application of a second mask 2402 according to an embodiment. In some embodiments, after the first etch of the via openings 2302 through the die substrate 2106, the first mask 2202 is removed. A second mask 2402 is formed over the substrate extends into the via openings 2302. In some embodiments, the second mask 2402 is a photoresist deposited, by for example, spin coating, spray coating, or the like.

Figure 25:
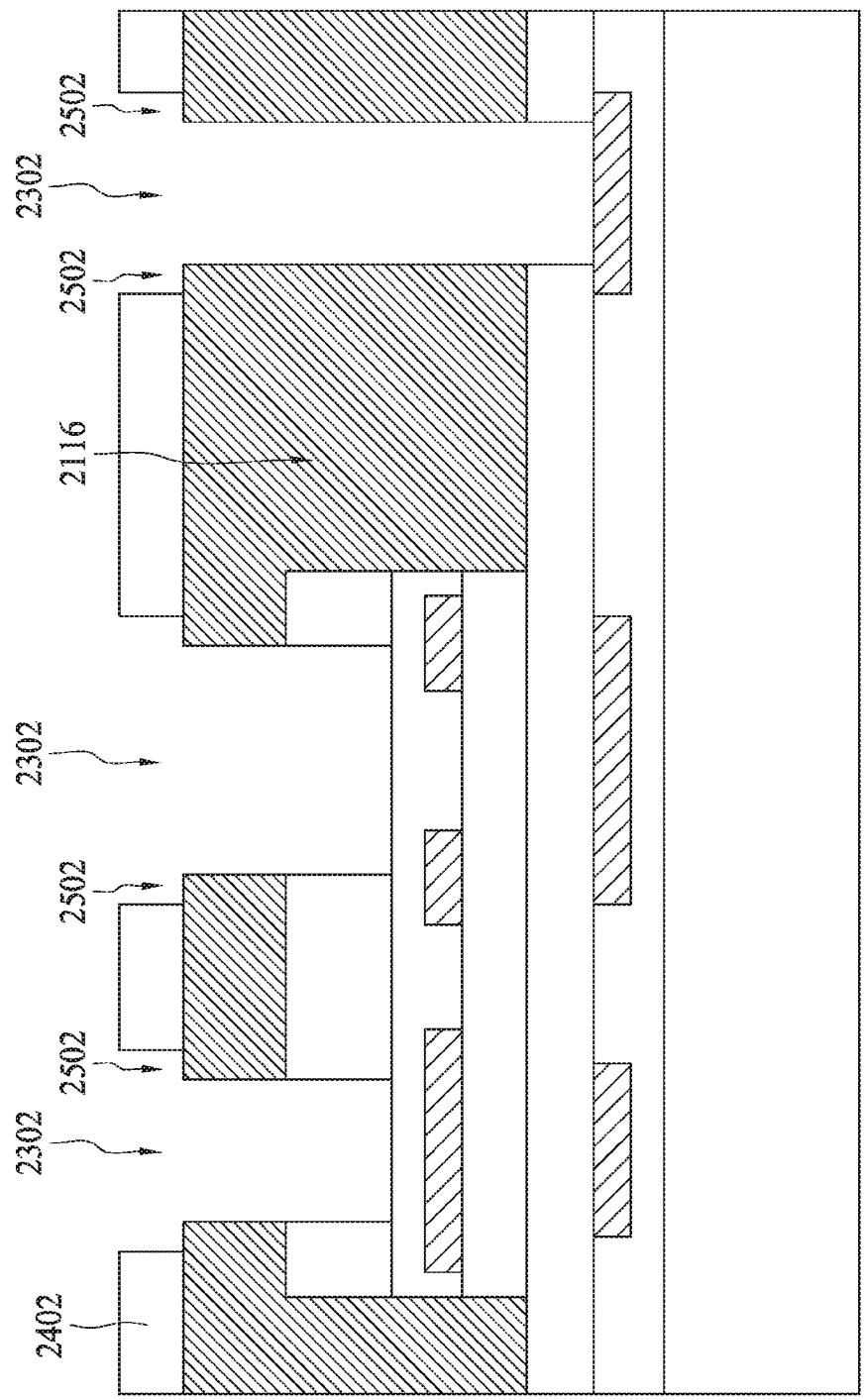

FIG. 25 illustrates a cross-sectional view of patterning the second mask 2402 according to an embodiment. In some embodiments, the second mask 2402 is exposed and developed to pattern the second mask 2402 with second mask openings 2502. In some embodiments, the second mask openings 2502 are wider than the via openings 2302 after the first etch, with the second mask openings 2502 disposed over the via openings 2302. Additionally, in some embodiments, the second mask openings 2502 define openings for metal lines that extend laterally from the via openings to provide electrical connectivity to vias subsequently formed in lower portions of the via openings 2302.

Figure 26:
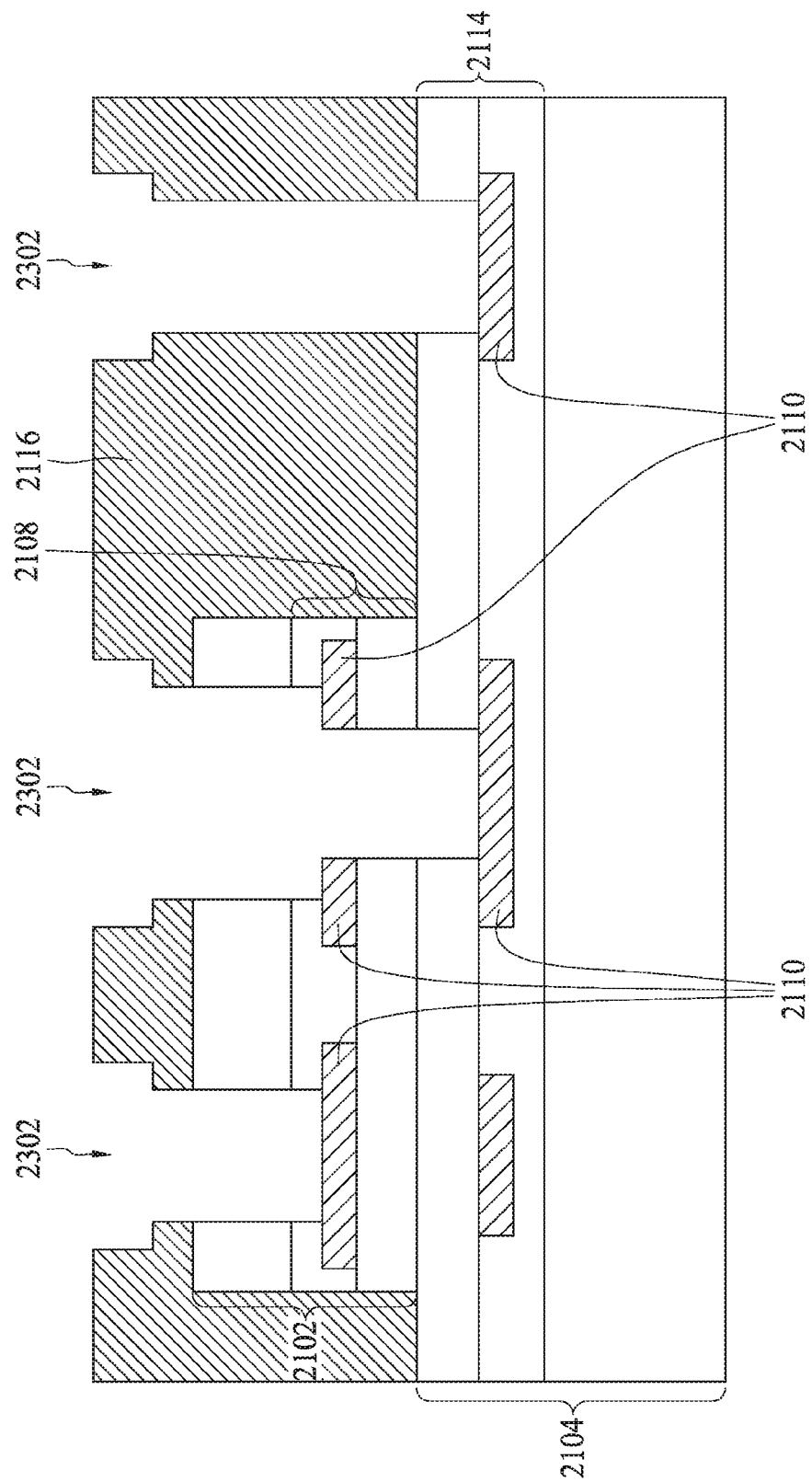

FIG. 26 illustrates a cross-sectional view of etching the RDLs 2108 and 2114 according to an embodiment. The RDLs 2108 and 2114 are etched and the second mask 2402 is removed. In some embodiments, a time mode etch process is used so that the etching process etches a predetermined depth. Etching with the second mask results in upper portions of the via openings 2302 having a width wider than the lower portions of the via openings 2302. The time mode etch controls the depth of the upper portions of the via openings 2302, and results in the lower portions of the via openings 2302 being extended downward to expose the underlying conductive elements 2110.

Figure 27:
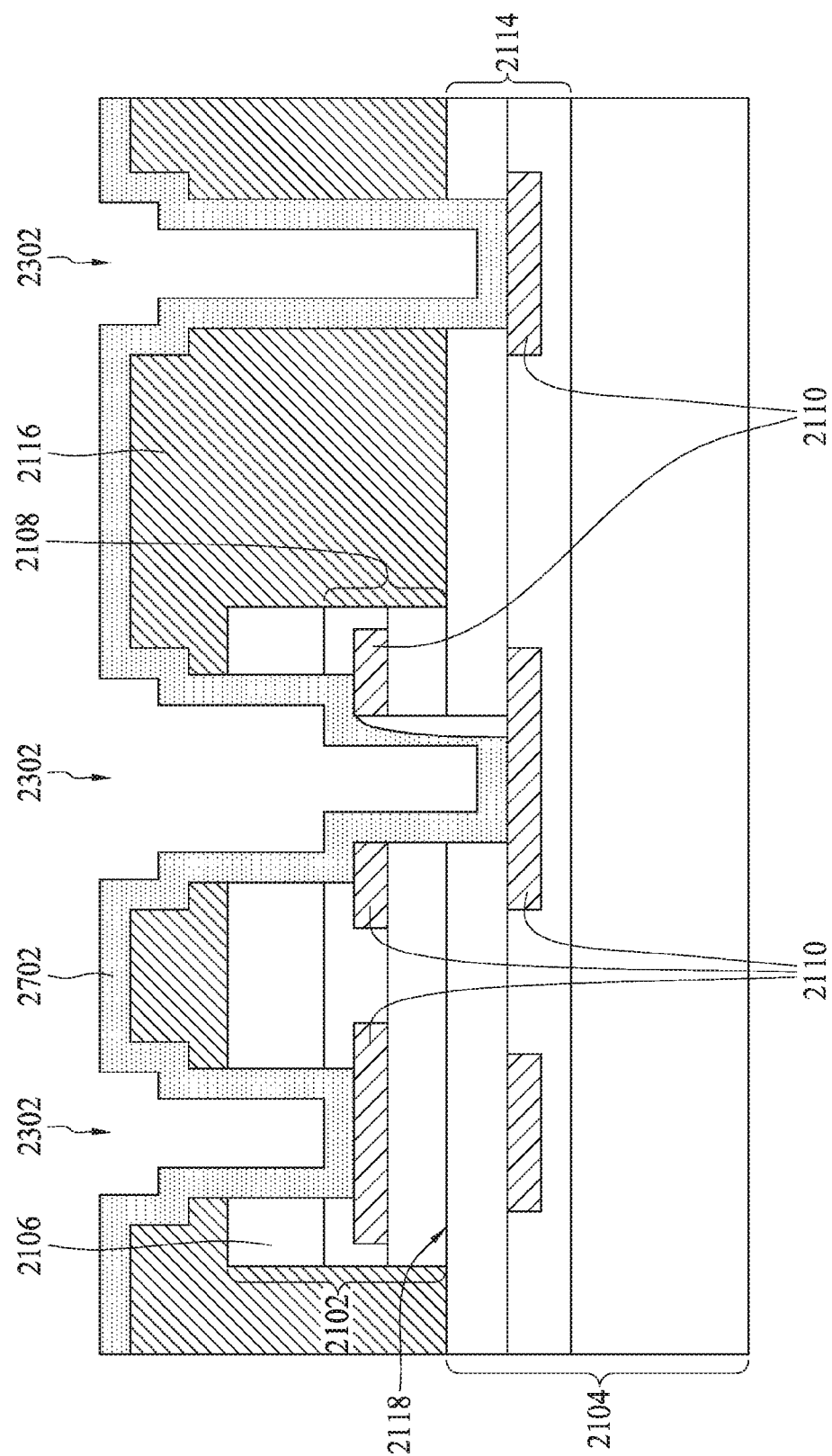

FIG. 27 is a cross-sectional view illustrating formation of an isolation layer 2702 according to an embodiment. A conformal dielectric isolation layer 2702 is formed over the molding compound 2116 and extends into the via openings 2302. In an embodiment, the isolation layer 2702 is formed as described above. The isolation layer 2702 extends into each of the via openings 2308 and covers the sidewalls of the via openings 2308, including the portions of the die substrate 2106 exposed in the via openings 2302.

Figure 28:
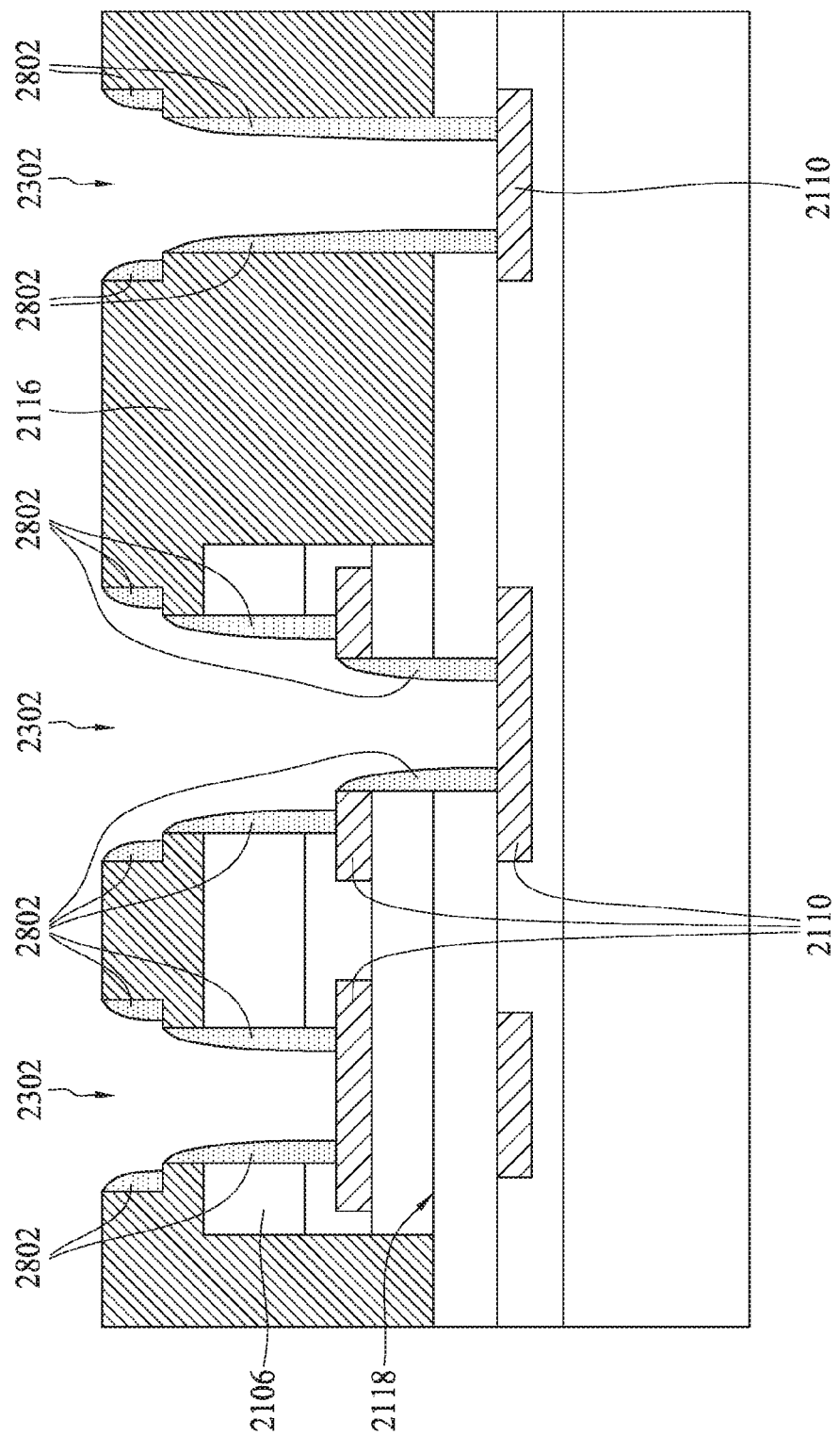

FIG. 28 is a cross-sectional view illustrating formation of self-aligning spacers 2802 according to an embodiment. In some embodiments, the isolation layer 2702 (see FIG. 27) is etched as described above, removing the lateral portions of the isolation layer 2702 and leaving the spacers 2802 on the sidewalls of the via openings 2302. The spacers 2802 insulate the die substrate 2106 from the via openings 2302 and expose portions of the top surfaces of the conductive elements 2110. In some dual damascene embodiments, separate spacers 2802 are formed in the upper and lower portions of the via openings 2302, with the upper and lower spacers 2802 laterally separated from each other and exposing a lateral surface of the molding compound 2116. Additionally, the lower spacers 2802 extend from conductive elements 2110 in the RDLs 2108 and 2114 above the die substrate 2106 into the molding compound 2116.

Figure 29:
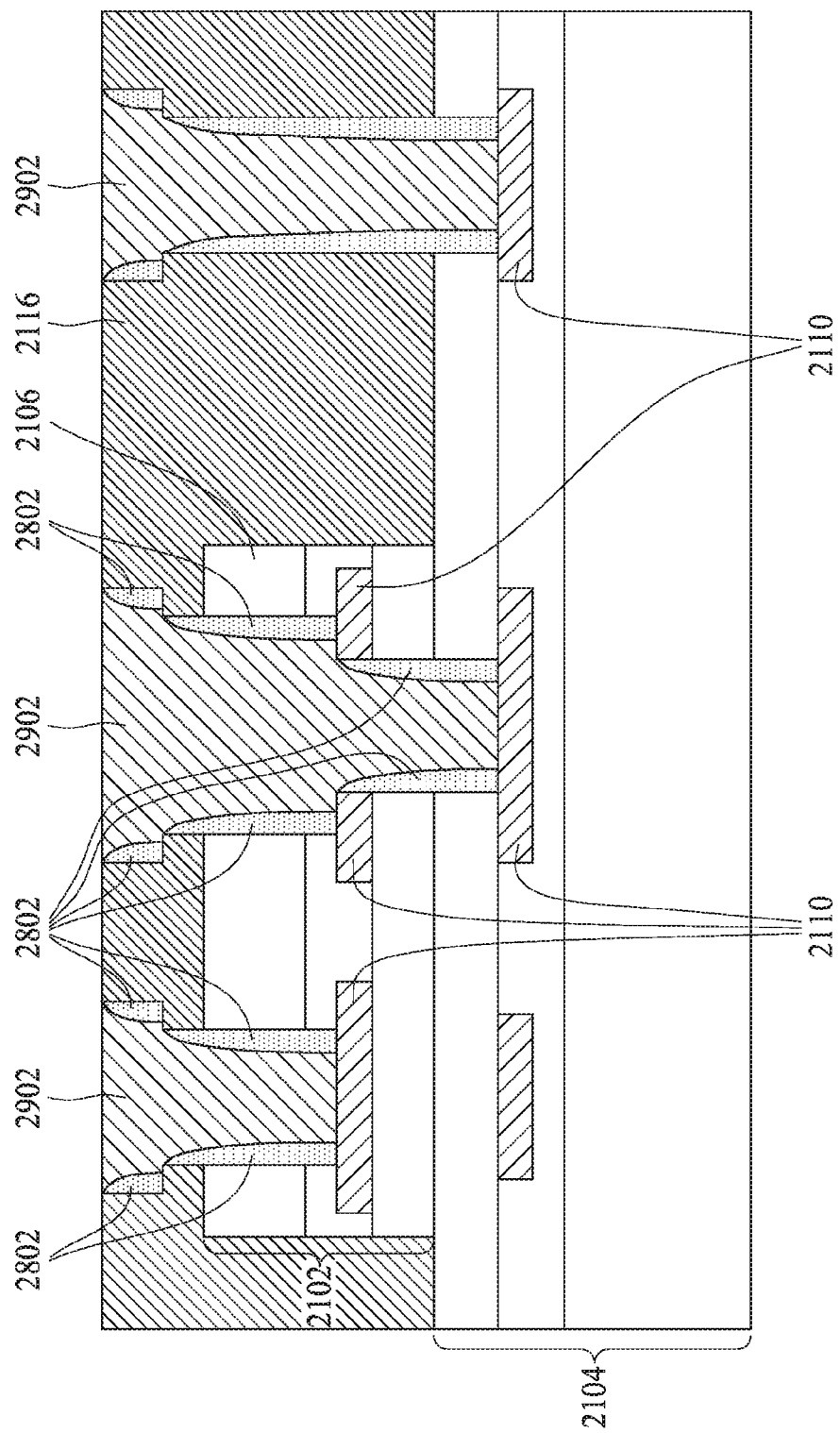

FIG. 29 is a cross-sectional view illustrating formation of vias 2902 in the via openings 702 according to an embodiment. In some embodiments, the vias 2902 are formed as described above. The vias 2902 are insulated from the die substrate 2106 by the spacers 2802 and extend from the top surface of the molding compound 2116 to the conductive elements 2110. In some embodiments, the top portions of the vias 2902 extend laterally through the top portion of the molding compound 2116, forming a first layer for a top RDL in the molding compound 2116. Forming the spacers 2802 after the second etch permits the spacers to be formed full height within the via openings 2302. In some embodiments, a barrier layer, seed layer and metal layer are formed in the via openings 2302, and then reduced by CMP or the like. Thus, discrete steps form forming the conductive elements of the first layer of the top RDL can be consolidated into the via formation process, reducing costs and increasing throughput.

FIGS. 30 through 35 illustrate cross-sectional views of intermediate processing steps in forming a chip-on-wafer structure with multiple sets of vias formed through the via last process, permitting three or more dies to be stacked in a 3D Chip-on-wafer-on-substrate package. It has been discovered that the via last process can be used to provide inter-chip connectivity for stacked dies with a pitch that is 10 µm of less, and provide the improved pitch without solder balls or microbumps between the stacked chips. Additionally, the via last process permits dies to be directly bonded without requiring that metal pads in bonded RDLs be in contact during the bonding process. The via last process further permits dies of different widths to be stacked without additional process steps, as the via last process can form vias through molding compound in the same process steps as vias through the stacked dies, and permits the use of fan-out via layouts.

Figure 30:
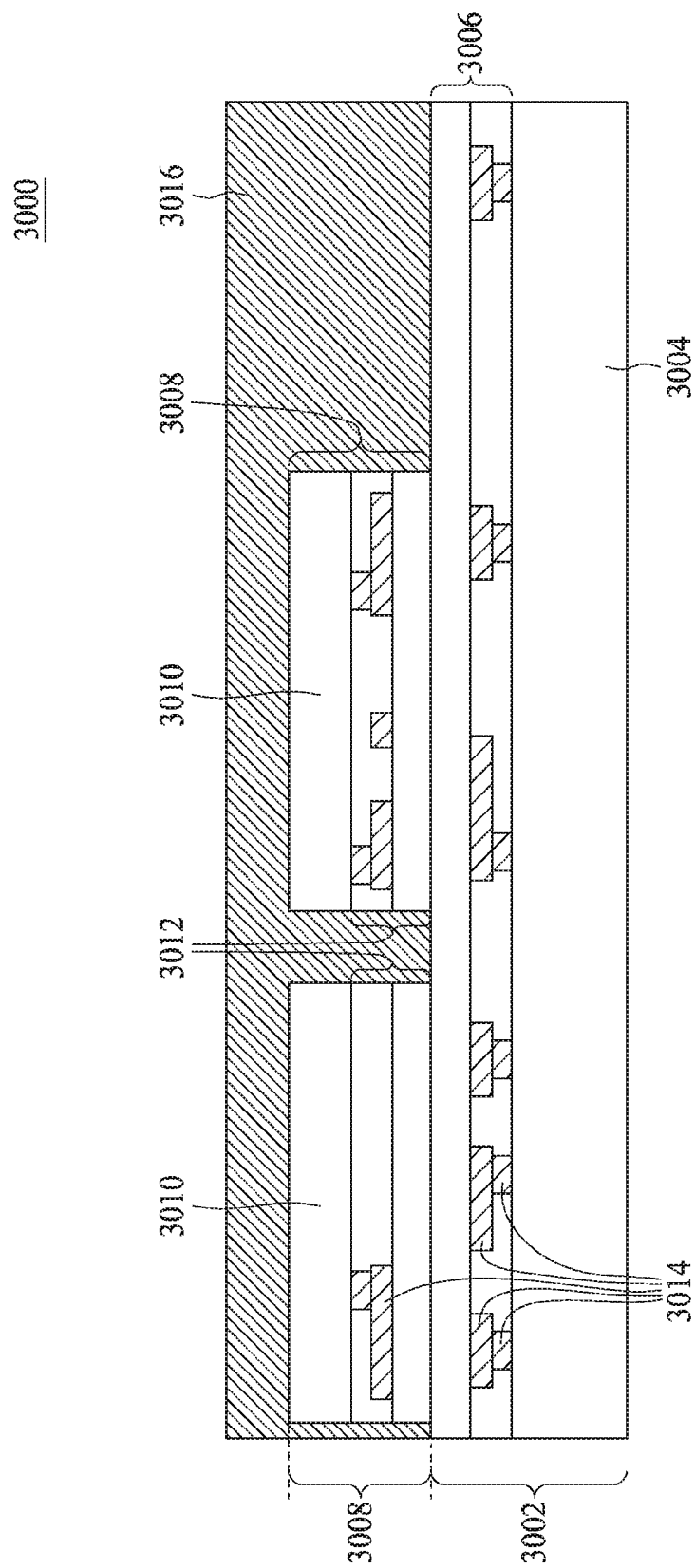
FIGS. 30-35 illustrate cross-sectional views of intermediate processing steps in forming a 3D chip-on-wafer-on-substrate structure according to some embodiments.

FIG. 30 illustrates a cross-sectional view of an initial step in forming a package 3000 with multiple layers of vias according to an embodiment. Initially, a first die 3002 is provided. One or more second dies 3008 are mounted on the first die 3002. The first die 3002 has a first substrate 3004 with a first RDL 3006, and the second dies 3008 each have a second substrate 3010 and a second RDL 3012. Conductive elements 3014 are disposed in the RDLs 3006 and 3012, and are electrically connected to the respective substrates 3004 and 3010. In some embodiments, the second dies 3008 are bonded to the first die 3002 with a direct bonding technique. For example, in some embodiments, the second dies 3008 have the second RDLs 3012 bonded to the first RDL 3006 using an oxide-to-oxide bond. In other embodiments, the second dies 3008 are bonded to the first die 3002 with an adhesive, using a hybrid bonding technique, or another bonding technique.

While the embodiments illustrated herein show two second dies 3008 being bonded to a single first die 3002, the embodiments are intended to be illustrative, and are not limiting. For example, in other embodiments, a single second die 3008 is bonded to a single first die 3002, or to multiple first dies 3002. Additionally, the second dies 3008 are illustrated as being narrower than the first die 3002, leaving a space above the first RDL 3006 uncovered by any of the second dies 3008. However, the widths and arrangements of the second dies 3008 with respect to the first die 3002 are shown in order to illustrate a fan-out arrangement, and are not intended to be limiting.

A first molding compound 3016 is formed over the first die 3002 and second dies 3008. In an embodiment, the first molding compound 3016 is formed as described above with respect to FIG. 3, 16 or 21. In some embodiments, the molding compound 3016 extends over the second die 3008 and fills the region between the second dies 3008 and the region adjacent to the second dies over the first die 3002. In other embodiments, the first molding compound 3016 is planarized to be about level or planar with the top surfaces of the second substrate 3010.

Figure 31:
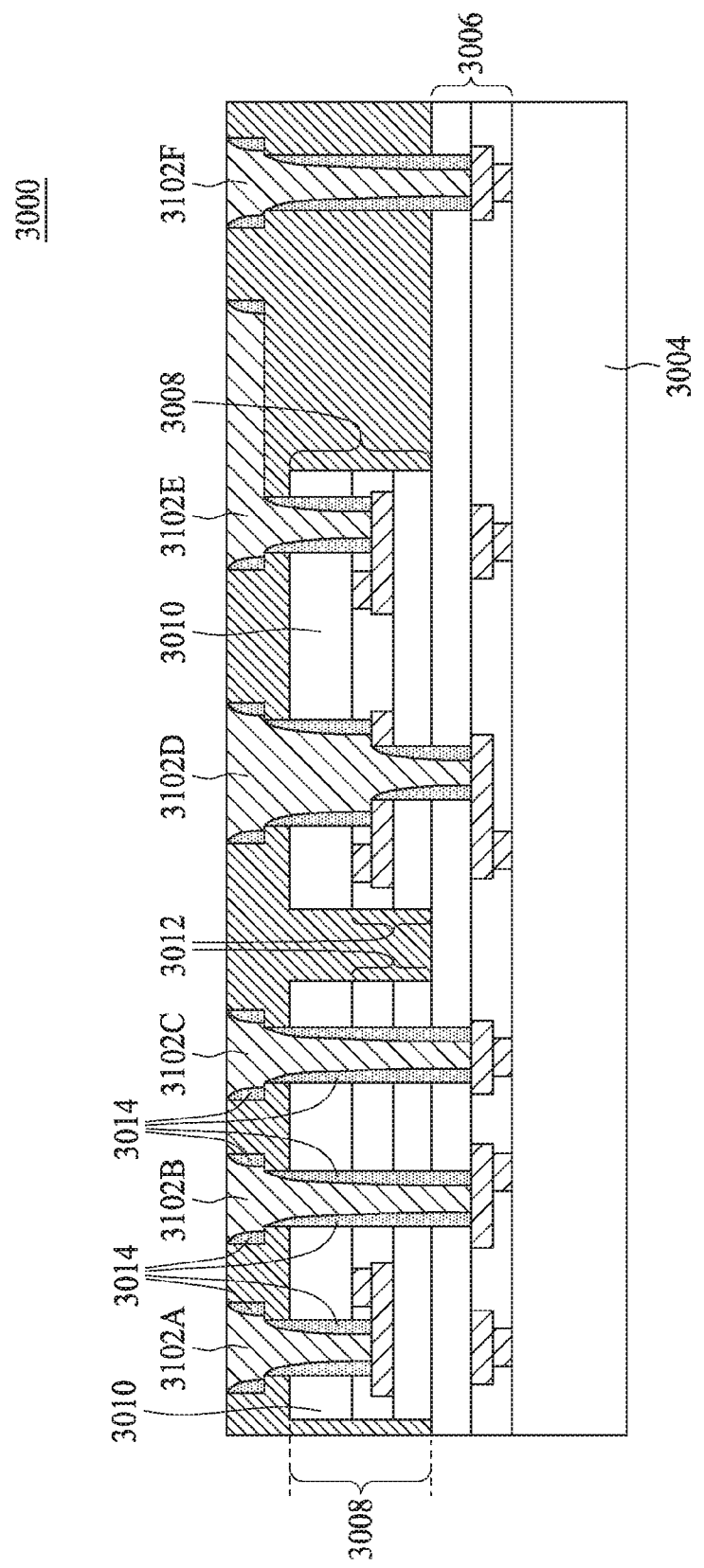

FIG. 31 illustrates a cross-sectional view of forming of first vias 3102 through the second dies 3008 to the first RDL 3006 and second RDLs 3012 according to some embodiments. Multiple ones of the individual first vias 3102A ... 3102F are referred to collectively as the first vias 3102 for convenience. The first vias 3102 are illustrated here as being formed by the dual damascene via last technique, as illustrated in FIGS. 21-29, however another via last technique can be used to form the vias 3102. For example, in some embodiments, the first vias 3102 are formed with full spacers according to the embodiments described in FIG. 1 through 15, or with partial height spacers according to the embodiments described in FIGS. 16 through 20.

First vias 3102 are formed through the second dies 3008 to conductive elements 3014 in the RDLs 3006 and 3012, which electrically connect the first vias 3102 to the first substrate 3004 or the second substrates 3010. In some embodiments, a first via 3102 connects the first substrate 3004 to one of the second substrates 3010. For example, first via 3102D connects to both a conductive element 3104 in the one of the second RDLs 3012 and to a conductive element 3014 in the first RDL 3006, providing interchip connectivity between the first die 3002 and the second die 3008. Additionally, in some embodiments, a first via 3102F extends through the first molding compound 3016 adjacent to the second dies 3008 to a conductive element 3014 in the first RDL 3006. In some embodiments, a first via 3102E has a portion extending laterally through the first molding compound 3016 in a fan-out configuration.

Figure 32:
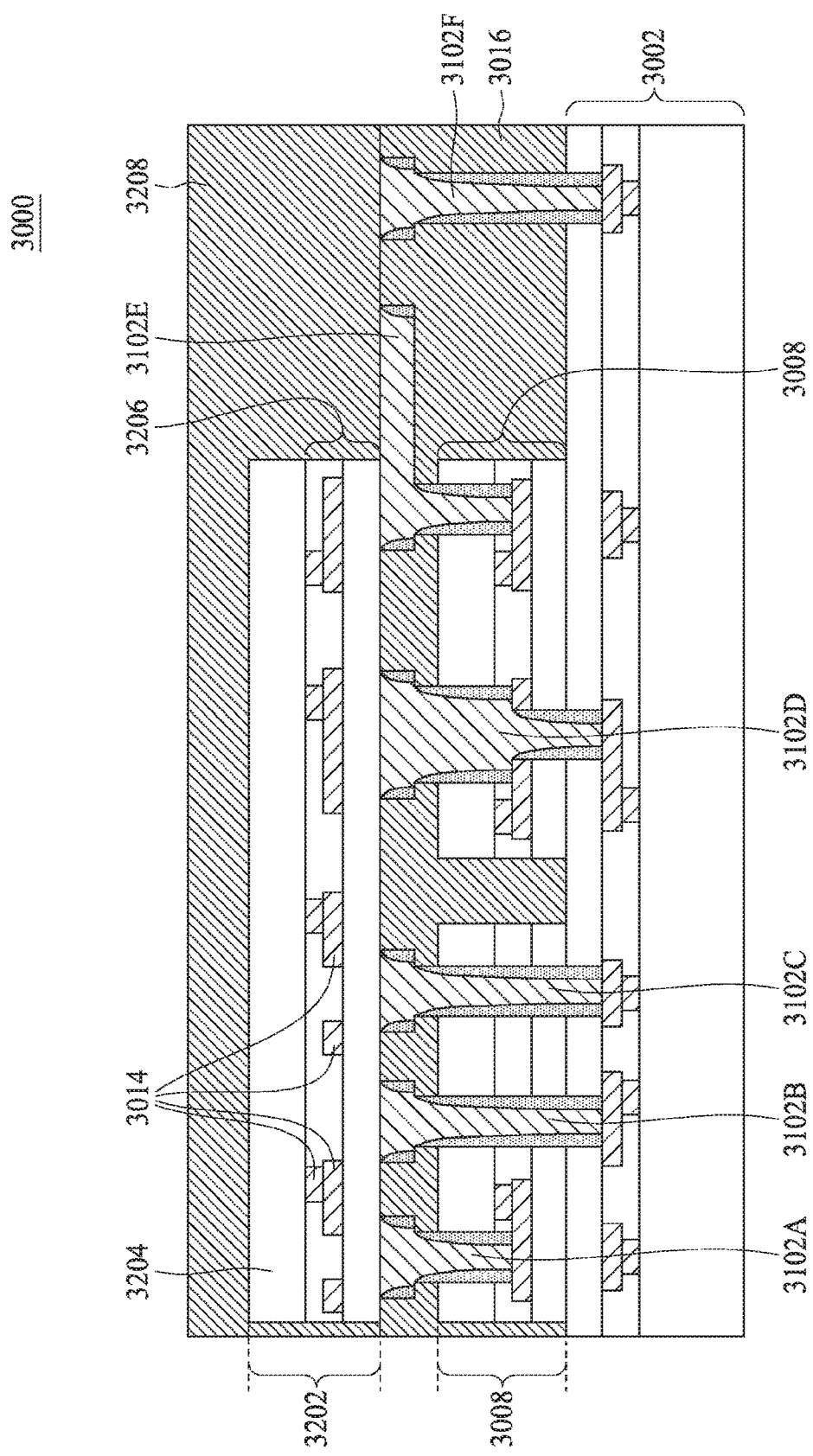

FIG. 32 illustrates a cross-sectional view of mounting a third die 3202 on the package 3000 according to some embodiments. The third die 3202 has a third substrate 3204 and a third RDL 3206 and is mounted over the second dies 3008. The third RDL 3206 has one or more conductive features 3104 connected to the third substrate 3204. In embodiments where the first molding compound 3016 extends over the second dies 3008, the third die 3202 is mounted on the top surface of the first molding compound 3016, and in embodiments where the second dies 3008 are exposed through the first molding compound 3016, the third die 3202 is mounted on the second dies 3008 and the top surface of the first molding compound 3016. The third die 3202 is mounted to the package with a die attachment film (DAF), an adhesive, with direct surface bonding or anther process. A second molding compound 3208 is formed around the third die 3202, and in some embodiments is formed as described above for the first molding compound 3106. In other embodiments, the second molding compound 3208 is formed around the third die 3202 prior to mounting the third die 3202 to the package 3000.

The third die 3202 is illustrated as being mounted directly on the top surface of the first molding compound 3106; however, the embodiments are not limited to such a structure. In other embodiments, one or more intermediate layers (not shown) are formed over the package 3000 prior to mounting the third die 3202. For example, a dielectric layer, protective layer, passivation layer, or another layer are formed over the first molding compound 3016 or second dies 3008, with the third die 3202 mounted to the intermediate layers.

Figure 33:
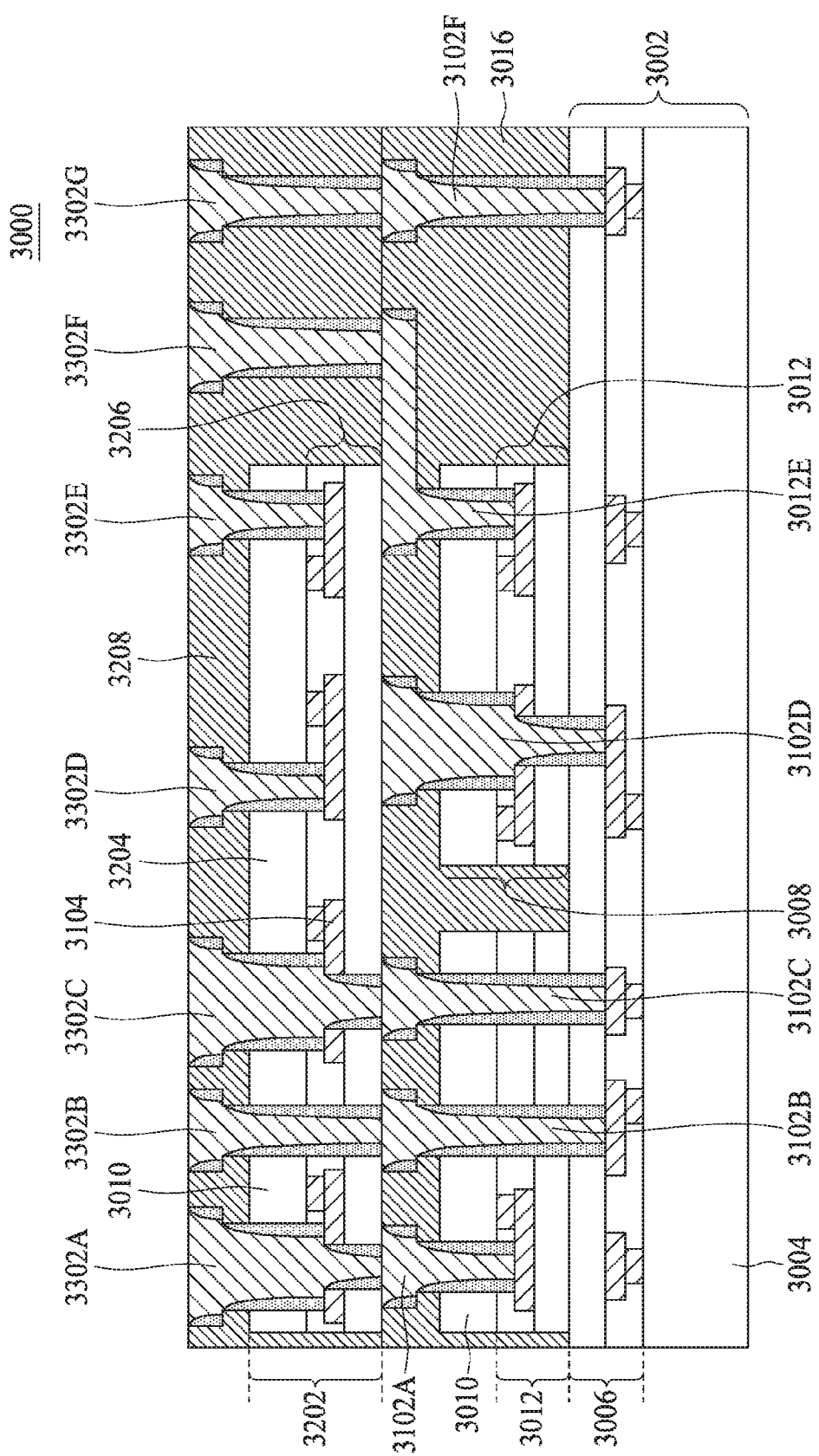

FIG. 33 illustrates a cross-sectional view of forming second vias 3302 through the third die 3202 and second molding compound 3208 according to some embodiments. Multiple ones of the individual second vias 3302A . . . 3302G are referred to collectively as the second vias 3302 for convenience. Similar to the first vias 3102, the second vias 3302 are illustrated here as being formed by the dual damascene via last technique, but in other embodiments, are formed with a full height spacer or partial height spacer technique. Additionally, while the first vias 3102 and second vias 3302 are shown as being formed using the same technique, the different layers of vias are formed, in some embodiments, using different via formation techniques.

In some embodiments, one or more of the second vias 3302 extend through the third substrate 3204 to contact conductive elements 3104 in the third RDL 3206. For example, second vias 3302D and 3302E extend to conductive elements 3104 in the third RDL 3206 to provide, for example, power or communication connectivity between the third substrate 3204 and a subsequently formed external connector. In such an example, the second vias 3302D and 3302E terminate within the third RDL 3206 and are insulated from the first molding compound 3016. This permits a first via 3102 to be under a second via 3302 without contacting the second via 3302. For example, first via 3102D provides interchip connectivity between the first die 3002 and a second die 3008, but does not require connectivity to an external connector, and can be aligned under a second via 3302D that terminates in the third RDL 3206. Thus, first via 3102D is electrically insulated from the second vias 3302. In another example, a first via 3102E extends laterally from underneath a second via 3302E that terminates in the third RDL 3206. A different second via 3302, such as second via 3302F, provides connectivity between the first via 3102E and a subsequently formed external connector.

Additionally, in some embodiments, one or more of the second vias 3302 extend through the third RDL 3206 to contact the top surfaces of the first vias 3102. For example, second via 3302B extends through the third RDL 3206 and contacts the top surface of first via 3102B to provide, for example, power or communication connectivity between the first substrate 3004 and a subsequently formed external connector.

In some embodiments, one or more of the second vias 3302 contact a conductive element 3104 in the third RDL 3206 and a first via 3102. Thus, communication connectivity can be provided between the third substrate 3204 and the first substrate 3004 or the second substrate 3010. For example, second via 3302A contacts a conductive element 3104 in the third RDL 3206 and extends through the conductive element 3104 to contact first via 3102A. The first via 3102A contacts a conductive element 3104 in the second RDL 3012 that is in turn connected to the second substrate 3010. Similarly, second via 3302C contacts a conductive element 3104 in the third RDL 3206, and extends through the conductive element 3104 to contact first via 3102C. The first via 3102C contacts a conductive element 3104 in the first RDL 3006 that is in turn connected to the first substrate 3004. Thus, interchip connections are provided between the third substrate 3204 and either the first substrate 3004 or the second substrate 3010 by way of the first vias 3102 and second vias 3302.

In some embodiments, the first die 3002 is wider than the third die 3202. In such embodiments, a portion of the second molding compound 3208 is disposed over the first molding compound 3016 adjacent to the third die 3202. Second vias 3302 are formed through the portion of the second molding compound 3208 that is adjacent to the third die 3202. For example, in some embodiments, a second via 3302G extends through the second molding compound 3208 to contact the top surface of a standard or vertical first via 3102F that extends into the first RDL 3006 and contacts a conductive element 3104. In another example, a second via 3302F extends through the second molding compound 3208 to contact the top surface of the portion of first via 3102E that extends laterally through the first molding compound 3016 in a fan-out configuration. Thus, power or data connectivity can be provided to the first die or second die 3008 without the second via 3102 passing through the third die 3202. Such an arrangement is used, for example, where the third die 3202 is narrower than the first die 3002.

Additionally, while the third die 3202 is illustrated herein as having the same width as the second dies 3008, the second dies 3008, in some embodiments, extend past the edges of the third die 3202. In such an embodiment, the second vias 3302 are disposed directly over the second dies 3008. The second vias 3302 extend through the second molding compound 3208 to contact the first vias 3102 that extend vertically through the second dies 3008. Alternatively, in other embodiments, the third die 3202 is wider than the second dies 3008, and extends past the edge of the second die 3008. In such embodiments one or more second vias 3302 are disposed laterally adjacent to, or outside the edges of, the second dies 3008 and extend through the third die 3202 to contact a first via 3102 that extends through a portion of the first molding compound 3016 that is adjacent to the second dies 3008. Additionally, in some embodiments, a fan-in arrangement is used, with each of the first vias 3102 and second vias 3302 extending through a substrate. In such an embodiment, the first, die 3002, second dies 3008 and third die 3202 have edges that substantially align, with vias 3102F/3302G or 3302F being eliminated.

While the package 3000 illustrated herein shows three layers of dies, the package 3000 is not limited to such embodiments. In other embodiments, one or more additional layers are formed over the third die 3202, with additional vias extending through each of the layers to contact vias in the underlying layers. Furthermore, in some embodiments, vias are formed through both the top and bottom side of the package 3000. In such embodiments, additional layers, with additional dies, are formed on both sides of the package.

Figure 34:
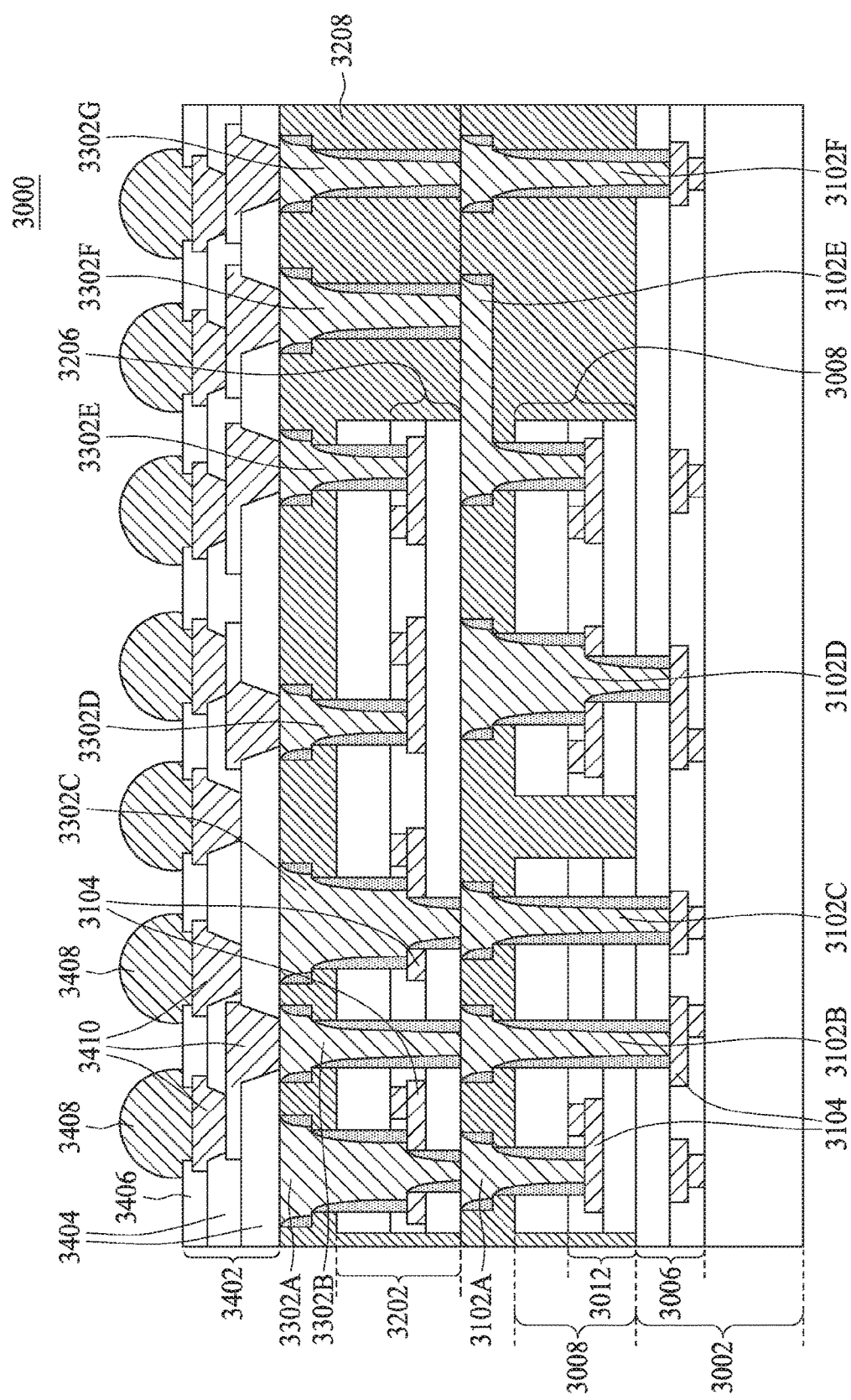

FIG. 34 illustrates a cross-sectional view of forming a top RDL 3402 over the second molding compound 3208 according to some embodiments. In some embodiments, the top RDL 3402, protective layer 3406 and connectors 3408 are formed using a process similar to those described above with respect to FIGS. 12-15. The top RDL 3402 has top RDL dielectric layers 3404 with one or more top RDL conductive elements 3410 connecting one or more of the second vias 3302 to the connectors 3408. The protective layer 3406 is disposed over the top RDL 3402, with the connectors 3408 extending through openings in the protective layer 3406 to contact the top RDL conductive elements 3410. The connectors 3408 are electrically connected to the second vias 3302, providing power or data connectivity to the first die 3002, as with via pairs 3302B/3102B or 3102F/3302G, to the second dies 3008, as with via pairs 3102E/3302F, or to the third die 3202, as with vias 3302D or 3302E.

In some embodiments, second vias 3302 that provide interchip connectivity between the third die 3202 and the first die 3002 or second dies 3008 are electrically insulated from the connectors 3408, while second vias 3302 providing power or data connectivity to the dies 3002, 3008 or 3202 are electrically connected to the connectors 3408. For example, second via 3302A contacts a conductive element 3104 in the third RDL 3206 and first via 3102A. First via 3102, in turn, contacts a conductive element 3104 in the second RDL 3012. Thus, interchip connectivity is provided between the third die 3202 and the second die 3008 by way of second via 3302A and first via 3102A. In such an example, the second via 3302 is not connected to a connector 3408 and is electrically insulated at a top surface by the top RDL dielectric layers 3404.

With some of the second vias 3302 being insulated from the connectors 3408, no top RDL conductive element 3410 is required over, or connecting to, some of the second vias 3302. Thus, the pitch or arrangement of the connectors 3408 is, in some embodiments, different than the pitch or arrangement of the second vias 3302. Additionally, some of the top RDL conductive elements 3410 extend laterally over the second vias 3302 that are insulated from the connectors 3408.

Figure 35:
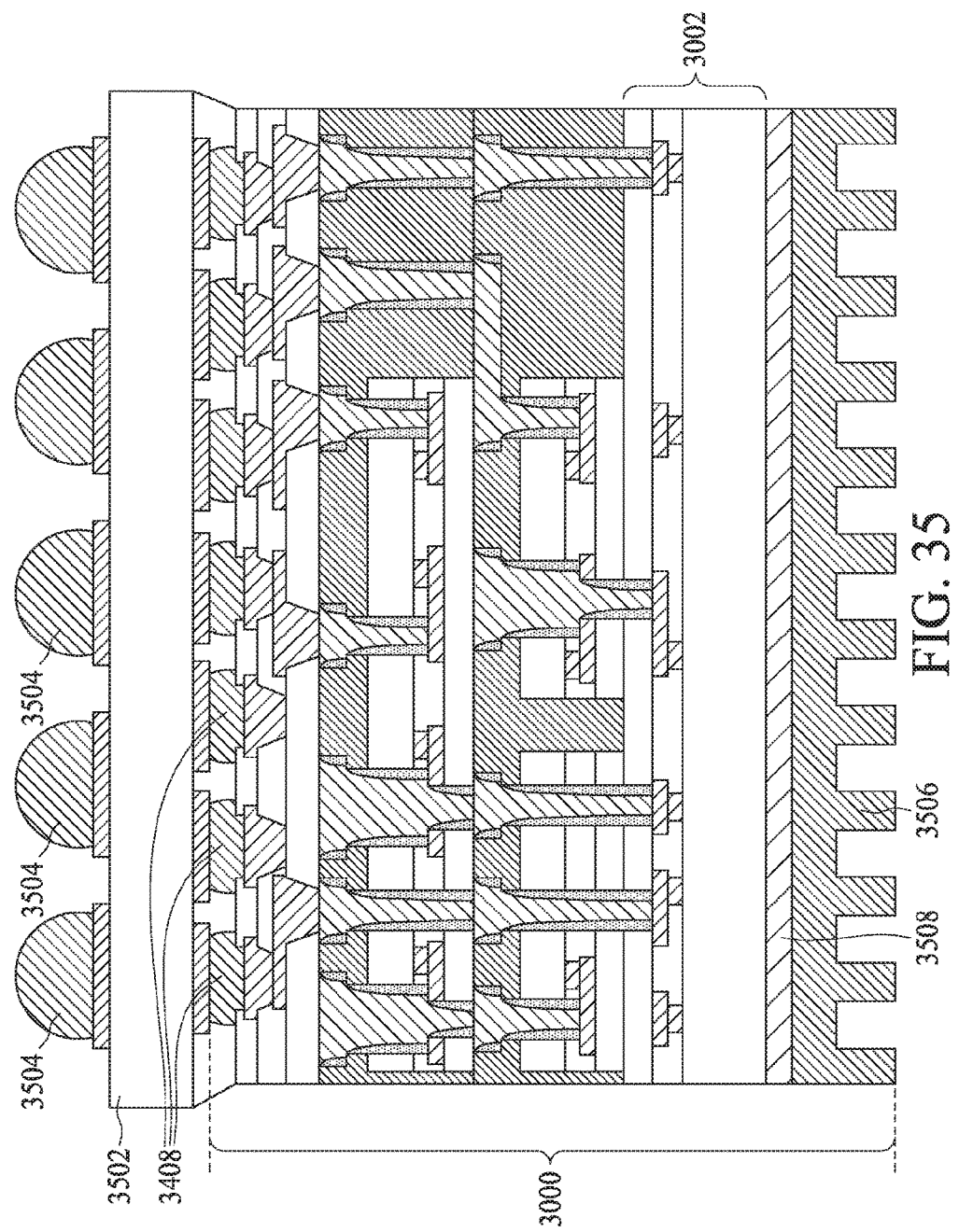

FIG. 35 illustrates a cross-sectional view of mounting the package 3000 on a second package 3502 according to some embodiments. The package 3000 is mounted by way of the connectors 3408 to the second package 3502, which may be a substrate, a die, a PCB, a chip, or another surface. In some embodiments, the second package 3502 has one or more second connectors 3504 opposite the connectors 3408. Additionally, on some embodiments, a heat dissipating structure such as a heat sink 3506 is attached to the package 3000 by an adhesive layer 3508 or by another bonding material or thermal adhesive. Additionally, while not shown, additional dies are, in some embodiments, mounted on the second package 3502 and are in electrical communication with the package 3000 through the second package.

Thus, a package according to an embodiment comprises a first die having a first redistribution layer (RDL) disposed on a first side of a first substrate and a second die having a second RDL disposed on a first side of a second substrate. The first RDL is bonded to the second RDL. A third die has a third RDL disposed on a first side of a third substrate. The third die is mounted over the second die, the second die disposed between the first die and the third die. First vias extend through, and are electrically isolated from, the second substrate, with the first vias each contacting a conductive element in the first RDL or the second RDL. Second vias extend through, and are electrically isolated from, the third substrate, with the second vias each contacting a conductive element in the third RDL or one of the first vias.

According to another embodiment, a package comprises a first die having a first redistribution layer (RDL) disposed on a first substrate and a second die having a second RDL disposed on a second substrate. The second die is disposed over the first die with the second RDL bonded to the first RDL. A first molding compound is disposed over the first die and around the second die. A third die has a third RDL disposed on a third substrate, with the third die disposed over the first molding compound. A second molding compound is disposed over the first molding compound and around the third die. First vias extend through the second substrate and each contact at least one conductive element in the first RDL or the second RDL. First spacers electrically insulate the first vias from the second substrate. Second vias extend through the third substrate and each contact a conductive element in the third RDL or one of the first vias. Second spacers electrically insulate the second vias from the third substrate.

A method according to an embodiment comprises providing a first die having a first redistribution layer (RDL) disposed on a first substrate, with the first RDL comprising a first oxide layer and providing a second die having a second RDL disposed on a second substrate, with the second RDL comprising a second oxide layer. The first die is bonded to the second die by bonding the first oxide layer to the second oxide layer with an oxide-to-oxide bond. First openings are formed in the second die after the bonding the first die to the second die. The first openings extend through the second substrate and expose first conductive elements in the first RDL or the second RDL. First vias are formed in the first openings, with the first vias extending through the second substrate and each contacting a respective one of the first conductive elements. The first vias are electrically insulated from the second substrate. A third die is mounted over the second die, with the third die having a third RDL disposed on a third substrate. Second openings in the third die after the mounting the third die over the second die. The second openings each extend through the third substrate and expose one of the first vias or a second conductive element in the third RDL. Second vias are formed in the second openings, with the second vias extending through the third substrate and contacting a respective one of the second conductive elements or one of the first vias. The second vias are electrically insulated from the third substrate.

In accordance with an embodiment, a method includes bonding a first die to a second die by directly bonding a first oxide layer of the first die to a second oxide layer of the second die with an oxide-to-oxide bond, the first die comprises a first semiconductor substrate and the second die comprises a second semiconductor substrate; forming a first opening in the second die after the bonding the first die to the second die, wherein the first opening extends through the second semiconductor substrate and exposes a first conductive element of the first die or the second die; forming a first via in the first opening, the first via is electrically insulated from the second semiconductor substrate by a first spacer; mounting a third die over the second die, the third die having a third semiconductor substrate; forming a second opening in the third die after the mounting the third die over the second die, the second opening extending through the third semiconductor substrate and exposing the first via; and forming a second via in the second opening, the second via is electrically insulated from the third semiconductor substrate by a second spacer.

In accordance with an embodiment, a method includes bonding first semiconductor die to a second semiconductor die using a direct oxide-to-oxide bond; forming an insulating material over a first one of the first semiconductor die and the second semiconductor die, the insulating material at least laterally encapsulating a second one of the first semiconductor die and the second semiconductor die; patterning a first opening extending through a first semiconductor substrate of the first semiconductor die; forming a first spacer along a first sidewall of the first opening; and forming a conductive via in the first opening, the first spacer electrically insulates the conductive via from the first semiconductor substrate.

In accordance with an embodiment, a method includes bonding first semiconductor die to a second semiconductor die, the first semiconductor die comprising a first semiconductor substrate, and the second semiconductor die comprising a second semiconductor substrate; forming a first insulating material over the first semiconductor die and around the second semiconductor die; patterning a first opening extending through the second semiconductor substrate and a portion of the first insulating material over the second semiconductor substrate; forming a first spacer along a first sidewall of the first opening; and forming a first conductive via in the first opening, the first spacer electrically insulates the first conductive via from the second semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
bonding a first die to a second die by directly bonding a first oxide layer of the first die to a second oxide layer of the second die with an oxide-to-oxide bond, the first die comprises a first semiconductor substrate and the second die comprises a second semiconductor substrate;
forming a first opening in the second die after the bonding the first die to the second die, wherein the first opening extends through the second semiconductor substrate and exposes a first conductive element of the first die or the second die;
forming a first via in the first opening, the first via is electrically insulated from the second semiconductor substrate by a first spacer;
mounting a third die over the second die, the third die having a third semiconductor substrate;
forming a second opening in the third die after the mounting the third die over the second die, the second opening extending through the third semiconductor substrate and exposing the first via; and
forming a second via in the second opening, the second via is electrically insulated from the third semiconductor substrate by a second spacer.

2. The method of claim 1, further comprising:
forming a first molding compound over the first die and around the second die prior to the forming the first via; and
forming a second molding compound around the third die prior to the forming the second via.

3. The method of claim 2, wherein the first molding compound is disposed between the second die and the third die along a direction perpendicular to a major surface of the second semiconductor substrate.

4. The method of claim 2, further comprising:
forming a third via extending through the first molding compound adjacent the second die prior to the mounting the third die, wherein the third via extends through the first molding compound and contacts a second conductive element of the first die.

5. The method of claim 4, further comprising forming a fourth via through the second molding compound, wherein the fourth via contacts at least one of the first via or the third via.

6. The method of claim 1, further comprising:
prior to forming the first via, depositing a spacer layer along sidewalls and a bottom surface of the first opening; and
etching the spacer layer to remove lateral portions of the spacer layer and define the first spacer.

7. The method of claim 1, wherein the first conductive element is disposed in the first die, and wherein the first opening further exposes a third conductive element of the second die over the first conductive element.

8. The method of claim 1, wherein the third conductive element acts as an etch stop layer during forming the first opening.

9. A method comprising:
bonding first semiconductor die to a second semiconductor die using a direct oxide-to-oxide bond;
forming an insulating material over a first one of the first semiconductor die and the second semiconductor die, the insulating material at least laterally encapsulating a second one of the first semiconductor die and the second semiconductor die;
patterning a first opening extending through a first semiconductor substrate of the first semiconductor die;
forming a first spacer along a first sidewall of the first opening; and
forming a conductive via in the first opening, the first spacer electrically insulates the conductive via from the first semiconductor substrate.

10. The method of claim 9, wherein the insulating material comprises a molding compound.

11. The method of claim 9, wherein a width of the first one of the first semiconductor die and the second semiconductor die has a different width than the second one of the first semiconductor die and the second semiconductor die.

12. The method of claim 9, further comprising planarizing the insulating material so that a lateral surface of the insulating material is substantially level with a lateral surface of the second one of the first semiconductor die and the second semiconductor die.

13. The method of claim 9, wherein forming the insulating material further comprises forming the insulating material over the second one of the first semiconductor die and the second semiconductor die, and wherein patterning the first opening further comprises patterning the first opening through at least a portion of the insulating material.

14. The method of claim 9, further comprising forming redistribution layers over the first semiconductor die and the second semiconductor die, wherein the redistribution layers are electrically connected to the conductive via.

15. The method of claim 9, wherein patterning the first opening comprises exposing a first conductive feature in the second semiconductor die.

16. The method of claim 9, wherein patterning the first opening further comprises exposing a second conductive feature in the first semiconductor die.

17. A method comprising:
bonding first semiconductor die to a second semiconductor die, the first semiconductor die comprising a first semiconductor substrate, and the second semiconductor die comprising a second semiconductor substrate;
forming a first insulating material over the first semiconductor die and around the second semiconductor die;
patterning a first opening extending through the second semiconductor substrate and a portion of the first insulating material above the second semiconductor substrate;
forming a first spacer along a first sidewall of the first opening; and
forming a first conductive via in the first opening, the first spacer electrically insulates the first conductive via from the second semiconductor substrate.

18. The method of claim 17, wherein a first portion of the first conductive via in the portion of the first insulating material above the second semiconductor substrate is wider than a second portion of the first conductive via in the second semiconductor substrate.

19. The method of claim 17 further comprising:
disposing a third semiconductor die over the second semiconductor die, the third semiconductor die comprising a third semiconductor substrate;
encapsulating the third semiconductor die in a second insulating material disposed over the first insulating material;
patterning a second opening extending through at least a portion of the second insulating material; and
forming a second conductive via in the second opening, the second conductive via contacting the first conductive via.

20. The method of claim 19, wherein the second conductive via is laterally spaced apart from the second semiconductor die, and wherein the first conductive via has a fan-out configuration extending laterally past a sidewall of the second semiconductor die.

* * * * *